US012738453B2

(12) United States Patent
Spengler et al.

(10) Patent No.: US 12,738,453 B2
(45) **Date of Patent: *Sep. 15, 2026**

(54) METHOD FOR DETERMINING FOCAL PROPERTIES IN A TARGET BEAM FIELD OF A MULTI-BEAM CHARGED-PARTICLE PROCESSING APPARATUS

(71) Applicant: IMS Nanofabrication GmbH, Brunn am Gebirge (AT)

(72) Inventors: Christoph Spengler, Vienna (AT); Wolf Naetar, Vienna (AT); Matthias Liertzer, Hinterbrühl (AT)

(73) Assignee: IMS Nanofabrication GmbH, Brunn am Gebirge (AT)

( * ) Notice: Subject to any disclaimer, the term of this patent is extended or adjusted under 35 U.S.C. 154(b) by 331 days.

This patent is subject to a terminal disclaimer.

(21) Appl. No.: 18/596,458

(22) Filed: Mar. 5, 2024

(65) Prior Publication Data

US 2024/0304415 A1 Sep. 12, 2024

(30) Foreign Application Priority Data

Mar. 8, 2023 (EP) .................................... 23160723

(51) Int. Cl.
*H01J 37/31* (2006.01)
*H01J 37/15* (2006.01)
(Continued)

(52) U.S. Cl.
CPC ........ *H01J 37/3177* (2013.01); *H01J 37/153* (2013.01); *H01J 2237/0435* (2013.01); (Continued)

(58) Field of Classification Search
CPC ................. H01J 37/3177; H01J 37/153; H01J 2237/0435; H01J 2237/1516; H01J 2237/1532
See application file for complete search history.

(56) References Cited

U.S. PATENT DOCUMENTS 1,033,741 A 7/1912 Sims
1,420,104 A 6/1922 Howe et al.
(Continued)

FOREIGN PATENT DOCUMENTS

CN 202204836 U 4/2012
DE 869995 C 3/1953
(Continued)

OTHER PUBLICATIONS

Extended European Search Report for European Application No. 21175588.9, Search Completed Nov. 8, 2021, Mailed Nov. 16, 2021, 12 pgs.

(Continued)

*Primary Examiner* — Nicole M Ippolito
(74) *Attorney, Agent, or Firm* — KPPB LLP

(57) ABSTRACT

A method for determining focal properties in a target beam field of a charged-particle multi-beam processing apparatus is presented, where the focal properties relate to aperture images formed by the beamlets at or near the target within this apparatus, such as height of focus, astigmatic length, or size of blur. By modifying an electrostatic voltage of a lens or another suitable operating parameter of the projection optics, the landing angles of the beamlets are tilted by a small tilting angle, causing a small displacement of the positions where the beamlets hit the target surface. Using the amounts of displacement and the change of landing angles a map is generated that describes a mapping from the change of landing angles to the amounts of displacement as a function of the position, for instance by using a best fit to a predefined model; this map is then used to extract the focal properties, which in turn can be used to correct for imaging errors in the processing apparatus.

19 Claims, 17 Drawing Sheets

(51) Int. Cl.
*H01J 37/153* (2006.01)
*H01J 37/317* (2006.01)

(52) U.S. Cl.
CPC .................. *H01J 2237/1516* (2013.01); *H01J 2237/1532* (2013.01)

(56) References Cited

U.S. PATENT DOCUMENTS 1,903,005 A 3/1933 McCuen
2,187,427 A 1/1940 Middleton
2,369,796 A 2/1945 Ramberg
2,714,678 A 8/1955 Otto
2,820,109 A 1/1958 Dewitz
2,920,104 A 1/1960 Brooks et al.
3,949,265 A 4/1976 Holl
4,467,211 A 8/1984 Smith
4,735,881 A 4/1988 Kobayashi et al.
4,899,060 A 2/1990 Lischke
4,985,634 A 1/1991 Stengl et al.
5,103,101 A 4/1992 Neil et al.
5,241,185 A 8/1993 Meiri et al.
5,260,579 A 11/1993 Yasuda et al.
5,369,282 A 11/1994 Arai et al.
5,399,872 A 3/1995 Yasuda et al.
5,814,423 A 9/1998 Maruyama et al.
5,841,145 A 11/1998 Satoh et al.
5,847,959 A 12/1998 Veneklasen et al.
5,857,815 A 1/1999 Bailey et al.
5,876,902 A 3/1999 Veneklasen
5,933,211 A 8/1999 Nakasugi et al.
6,014,200 A 1/2000 Sogard et al.
6,043,496 A 3/2000 Tennant
6,049,085 A 4/2000 Ema
6,111,932 A 8/2000 Dinsmore
6,137,113 A 10/2000 Muraki
6,140,644 A 10/2000 Kawanami et al.
6,222,195 B1 4/2001 Yamada et al.
6,225,637 B1 5/2001 Terashima et al.
6,229,595 B1 5/2001 McKinley
6,252,339 B1 6/2001 Kendall
6,258,511 B1 7/2001 Okino et al.
6,280,798 B1 8/2001 Ring et al.
6,333,138 B1 12/2001 Higashikawa et al.
6,443,699 B1 9/2002 Mashey
6,472,673 B1 10/2002 Chalupka et al.
6,473,237 B2 10/2002 Mei
6,552,353 B1 4/2003 Muraki et al.
6,559,456 B1 5/2003 Muraki
6,617,587 B2 9/2003 Parker
6,768,123 B2 7/2004 Giering
6,768,125 B2 7/2004 Platzgummer et al.
6,815,693 B2 11/2004 Kamijo et al.
6,829,054 B2 12/2004 Stanke et al.
6,835,937 B1 12/2004 Muraki et al.
6,858,118 B2 2/2005 Platzgummer et al.
6,897,454 B2 5/2005 Sasaki et al.
6,965,153 B1 11/2005 Ono et al.
7,084,411 B2 8/2006 Lammer-Pachlinger et al.
7,124,660 B2 10/2006 Chiang
7,129,024 B2 10/2006 Ki
7,199,373 B2 4/2007 Stengl et al.
7,201,213 B2 4/2007 Leeson
7,214,951 B2 5/2007 Stengl et al.
7,276,714 B2 10/2007 Platzgummer et al.
7,368,738 B2 5/2008 Platzgummer et al.
7,446,601 B2 11/2008 LeChevalier
7,459,247 B2 12/2008 Bijnen et al.
7,511,290 B2 3/2009 Suzuki et al.
7,671,687 B2 3/2010 LeChevalier
7,687,783 B2 3/2010 Platzgummer et al.
7,710,634 B2 5/2010 Sandstrom
7,714,298 B2 5/2010 Platzgummer et al.
7,741,620 B2 6/2010 Doering et al.
7,772,574 B2 8/2010 Stengl et al.
7,777,201 B2 8/2010 Fragner et al.
7,781,748 B2 8/2010 Platzgummer
7,823,081 B2 10/2010 Sato et al.
8,057,972 B2 11/2011 Heinrich et al.
8,115,183 B2 2/2012 Platzgummer et al.
8,183,543 B2 5/2012 Platzgummer
8,198,601 B2 6/2012 Platzgummer et al.
8,222,621 B2 7/2012 Fragner et al.
8,227,768 B2 7/2012 Smick et al.
8,257,888 B2 9/2012 Sczyrba et al.
8,258,488 B2 9/2012 Platzgummer et al.
8,294,117 B2 10/2012 Kruit et al.
8,304,749 B2 11/2012 Platzgummer et al.
8,378,320 B2 2/2013 Platzgummer
8,502,174 B2 8/2013 Wieland
8,531,648 B2 9/2013 Jager et al.
8,546,767 B2 10/2013 Platzgummer et al.
8,563,942 B2 10/2013 Platzgummer
8,598,544 B2 12/2013 Van De Peut et al.
9,053,906 B2 6/2015 Platzgummer
9,093,201 B2 7/2015 Platzgummer et al.
9,099,277 B2 8/2015 Platzgummer
9,165,745 B2 10/2015 Luo
9,188,874 B1 11/2015 Johnson
9,269,543 B2 2/2016 Reiter et al.
9,335,638 B2 5/2016 Jager et al.
9,373,482 B2 6/2016 Platzgummer
9,443,699 B2 9/2016 Platzgummer et al.
9,478,395 B1 10/2016 Monahan et al.
9,495,499 B2 11/2016 Platzgummer et al.
9,520,268 B2 12/2016 Platzgummer
9,568,907 B2 2/2017 Platzgummer et al.
9,653,263 B2 5/2017 Platzgummer et al.
9,799,487 B2 10/2017 Platzgummer
10,325,757 B2 6/2019 Platzgummer et al.
10,483,080 B1 11/2019 Cook et al.
10,553,394 B2 2/2020 Jedidi et al.
10,651,010 B2 5/2020 Platzgummer et al.
12,040,157 B2 7/2024 Platzgummer et al.
12,481,214 B2 11/2025 Spengler et al.
2001/0028038 A1 10/2001 Hamaguchi et al.
2002/0000524 A1 1/2002 Suzuki et al.
2002/0021426 A1 2/2002 Mei et al.
2002/0148978 A1 10/2002 Innes et al.
2003/0085360 A1 5/2003 Parker et al.
2003/0106230 A1 6/2003 Hennessey
2003/0139054 A1 7/2003 Fujimoto
2003/0155534 A1 8/2003 Platzgummer et al.
2003/0160980 A1 8/2003 Olsson et al.
2003/0189181 A1 10/2003 Ohta et al.
2004/0058536 A1 3/2004 Ki
2004/0119021 A1 6/2004 Parker et al.
2004/0119026 A1 6/2004 Sohda et al.
2004/0135102 A1 7/2004 Muraki et al.
2004/0157407 A1 8/2004 Qin-Yi et al.
2004/0169147 A1 9/2004 Haruhito et al.
2005/0063510 A1 3/2005 Hieronimi et al.
2005/0072941 A1 4/2005 Tanimoto et al.
2005/0104013 A1 5/2005 Stengl et al.
2005/0214657 A1 9/2005 Mitsui
2005/0242302 A1 11/2005 Platzgummer et al.
2005/0242303 A1 11/2005 Platzgummer
2006/0060775 A1 3/2006 Sakakibara et al.
2006/0076509 A1 4/2006 Okino et al.
2006/0169925 A1 8/2006 Miyajima et al.
2006/0169927 A1 8/2006 Muraki et al.
2006/0208205 A1 9/2006 Chen et al.
2007/0050749 A1 3/2007 Ye et al.
2007/0057204 A1 3/2007 Kruit et al.
2007/0138374 A1 6/2007 Nishibashi et al.
2007/0178407 A1 8/2007 Hatakeyama et al.
2007/0279768 A1 12/2007 Shibazaki et al.
2008/0024745 A1 1/2008 Baselmans et al.
2008/0080782 A1 4/2008 Olsson et al.
2008/0099693 A1 5/2008 Platzgummer et al.
2008/0105827 A1 5/2008 Tamamushi
2008/0128638 A1 6/2008 Doering et al.
2008/0142728 A1 6/2008 Smick et al.
2008/0198352 A1 8/2008 Kugler et al.
2008/0203317 A1 8/2008 Platzgummer et al.

(56) References Cited

U.S. PATENT DOCUMENTS

2008/0237460 A1 10/2008 Fragner et al.
2008/0257096 A1 10/2008 Zhu et al.
2008/0260283 A1 10/2008 Ivansen
2008/0266413 A1 10/2008 Cohen et al.
2008/0283767 A1 11/2008 Platzgummer
2008/0299490 A1 12/2008 Takekoshi
2009/0032700 A1 2/2009 Park et al.
2009/0039285 A1 2/2009 Cooper
2009/0101816 A1 4/2009 Noji et al.
2009/0114818 A1 5/2009 Casares et al.
2009/0200495 A1 8/2009 Platzgummer et al.
2009/0212229 A1 8/2009 Wieland et al.
2009/0256075 A1 10/2009 Kemen et al.
2009/0321631 A1 12/2009 Smick et al.
2010/0127185 A1 5/2010 Fragner et al.
2010/0127431 A1 5/2010 Sandstrom
2010/0178602 A1 7/2010 Seto et al.
2010/0187434 A1 7/2010 Platzgummer et al.
2010/0224790 A1 9/2010 Platzgummer et al.
2010/0288938 A1 11/2010 Platzgummer
2011/0049393 A1 3/2011 De Boer et al.
2011/0053087 A1 3/2011 Nielsen et al.
2011/0073782 A1 3/2011 Wieland
2011/0121208 A1 5/2011 Nakayamada et al.
2011/0204253 A1 8/2011 Platzgummer et al.
2011/0226968 A1 9/2011 Platzgummer
2012/0007002 A1 1/2012 Nakayamada et al.
2012/0076269 A1 3/2012 Roberts et al.
2012/0085940 A1 4/2012 Matsumoto
2012/0091318 A1 4/2012 Wieland et al.
2012/0211674 A1 8/2012 Kato
2012/0286169 A1 11/2012 Van de Peut et al.
2012/0286170 A1 11/2012 Van de Peut et al.
2012/0286173 A1 11/2012 Van de Peut et al.
2012/0288787 A1 11/2012 Choi et al.
2013/0128247 A1 5/2013 Khuat et al.
2013/0157198 A1 6/2013 Yoshikawa et al.
2013/0164684 A1 6/2013 Yamanaka
2013/0198697 A1 8/2013 Hotzel et al.
2013/0216954 A1 8/2013 Oishi et al.
2013/0252145 A1 9/2013 Matsumoto et al.
2013/0253688 A1 9/2013 Matsumoto et al.
2013/0342827 A1 12/2013 Ummethala et al.
2014/0042334 A1 2/2014 Wieland
2014/0061499 A1 3/2014 Ogasawara et al.
2014/0168629 A1 6/2014 Nishida et al.
2014/0197327 A1 7/2014 Platzgummer
2014/0240732 A1 8/2014 Tinnemans et al.
2014/0264085 A1 9/2014 Van De Peut et al.
2014/0322927 A1 10/2014 Morita
2014/0346369 A1 11/2014 Matsumoto
2015/0021493 A1 1/2015 Platzgummer
2015/0028230 A1 1/2015 Platzgummer
2015/0069260 A1 3/2015 Platzgummer
2015/0243480 A1 8/2015 Yamada
2015/0248993 A1 9/2015 Reiter et al.
2015/0311030 A1 10/2015 Platzgummer et al.
2015/0311031 A1 10/2015 Platzgummer et al.
2015/0347660 A1 12/2015 Platzgummer et al.
2015/0357157 A1 12/2015 Mueller
2016/0012170 A1 1/2016 Platzgummer
2016/0013019 A1 1/2016 Platzgummer
2016/0071684 A1 3/2016 Platzgummer et al.
2016/0276131 A1 9/2016 Platzgummer
2016/0276132 A1 9/2016 Platzgummer et al.
2016/0336147 A1 11/2016 Platzgummer
2017/0294287 A1 10/2017 Knippelmeyer et al.
2017/0357153 A1 12/2017 Platzgummer
2017/0358425 A1 12/2017 Iizuka
2018/0173108 A1 6/2018 Hofmann et al.
2019/0198290 A1 6/2019 Inoue
2019/0198293 A1 6/2019 Ogasawara
2020/0051261 A1 2/2020 Tsuruyama et al.
2020/0312619 A1 10/2020 Mangnus et al.
2021/0240074 A1 8/2021 Spengler et al.
2022/0246388 A1 8/2022 Rauwolf et al.
2022/0384143 A1 12/2022 Platzgummer et al.
2023/0015805 A1 1/2023 Spengler et al.
2023/0052445 A1 2/2023 Platzgummer et al.
2023/0260749 A1 8/2023 Morita
2023/0360878 A1 11/2023 Puchberger et al.
2023/0360880 A1 11/2023 Eder-Kapl et al.
2024/0304407 A1 9/2024 Platzgummer
2024/0304413 A1* 9/2024 Spengler ............... H01J 37/222
2024/0427254 A1 12/2024 Spengler et al.
2025/0349507 A1 11/2025 Platzgummer et al.

FOREIGN PATENT DOCUMENTS

DE 892036 C 10/1953
DE 893107 C 10/1953
DE 1035813 B 8/1958
EP 0178156 A2 4/1986
EP 1033741 A2 9/2000
EP 1387389 A2 2/2004
EP 1993118 A2 11/2008
EP 2019415 A1 1/2009
EP 2187427 A2 5/2010
EP 2214194 A1 8/2010
EP 2317535 A2 5/2011
EP 2363875 A1 9/2011
EP 2950325 A1 12/2015
EP 2993684 A1 3/2016
GB 689527 A 4/1953
GB 2349737 A 11/2000
JP 08213301 A 8/1996
JP 10106931 A 4/1998
JP 2006019436 A 1/2006
JP 2006332289 A 12/2006
WO 2006053358 A1 5/2006
WO 2006084298 A1 8/2006
WO 2008053140 A1 5/2008
WO 2009147202 A1 12/2009
WO 2012041464 A1 4/2012
WO 2012172913 A1 12/2012
WO 2022192088 A1 9/2022
WO 2022248196 A1 12/2022

OTHER PUBLICATIONS

Extended European Search Report for European Application No. 22171589.9, Search completed Oct. 24, 2022, Mailed Nov. 7, 2022, 5 pgs.

Extended European Search Report for European Application No. 22172309.1, Search completed Dec. 19, 2022, Mailed Jan. 3, 2023, 22 pgs.

Extended European Search Report for European Application No. 22189892.7, Search completed Feb. 20, 2023, Mailed Mar. 21, 2023, 10 pgs.

Extended European Search Report for European Application No. 23160723.5, Search completed Aug. 21, 2023, Mailed Aug. 31, 2023, 11 pgs.

European Search Report for Application No. 14177851, Search Completed Oct. 16, 2014, 1 pg.

European Search Report for European Application No. 14176645, Search Completed Dec. 1, 2014, 1 pg.

European Search Report for European Application No. 20155217, Search Completed Jul. 20, 2020, 1 pg.

Extended European Search Report for European Application No. 10450070.7, Search Completed Apr. 26, 2012, Mailed May 7, 2012, 11 pgs.

European Search Report for Application No. 08450077.6, Search Completed Jan. 22, 2010, 2 pgs.

European Search Report for Application No. 14165967, Search Completed Oct. 30, 2014, 2 pgs.

European Search Report for Application No. 14165970, Search Completed Jun. 18, 2014, 2 pgs.

European Search Report for Application No. 14176563, Search Completed Jan. 14, 2015, 2 pgs.

(56) References Cited

OTHER PUBLICATIONS

European Search Report for Application No. 14199183, Search Completed Jun. 19, 2015, 2 pgs.
European Search Report for Application No. 15164770, Search Completed Sep. 18, 2015, 2 pgs.
European Search Report for Application No. 15164772, Search Completed Sep. 11, 2015, 2 pgs.
European Search Report for Application No. 15171348, Search Completed Oct. 30, 2015, 2 pgs.
European Search Report for European Application No. 16160621, Search Completed Oct. 5, 2016, 2 pgs.
European Search Report for European Application No. 16174185, Search Completed Dec. 6, 2016, 2 pgs.
European Search Report for Application No. 14170611, Search Completed Nov. 4, 2014, 3 pgs.
European Search Report for Application No. 15159617.8, Search Completed Oct. 6, 2015, 3 pgs.
European Search Report for Application No. 15169632, Search Completed Oct. 20, 2015, 3 pgs.
Extended European Search Report for European Application No. 09450211.9, Search Completed Sep. 6, 2010, Mailed Sep. 14, 2010, 4 pgs.
Extended European Search Report for European Application No. 15159397.7, Search Completed Sep. 16, 2015, 5 pgs.
Extended European Search Report for European Application No. 16160622.3, Search Completed Jul. 21, 2016, Mailed Aug. 17, 2016, 7 pgs.
Extended European Search Report for European Application No. 09450212.7, Search Completed Sep. 13, 2010, Mailed Sep. 28, 2010, 8 pgs.
Extended European Search Report for European Application No. 14150119.7, Search Completed Jun. 2, 2014, Mailed Jun. 6, 2014, 8 pgs.
Berry et al., "Programmable Aperture Plate for Maskless High-Throughput Nanolithography", Journal of Vacuum Science & Technology, vol. B15, No. 6, Nov./Dec. 1997, pp. 2382-2386.
Borodovsky, Yan, "EUV, EBDW—ArF Replacement or Extension? ", KLA—Tencor Lithography User Forum, San Jose, CA, USA, Feb. 21, 2010, 21 pgs.
Borodovsky, Yan, "MPProcessing for MPProcessors", SEMATECH Maskless Lithography and Multibeam Mask Writer Workshop, New York, NY, USA, May 10, 2010, 35 pgs.
Disclosed Anonymously, "Multi-Tone Rasterization, Dual Pass Scan, Data Path and Cell Based Vector Format", IPCOM000183472D, printed from ip.com PriorArtDatabase, May 22, 2009, pp. 1-107.
Huber et al., "Computing Straight Skeletons and Motorcycle Graphs: Theory and Practice", Thesis, University of Salzburg (Austria), Jun. 2011, 134 pgs.
Kapl et al., "Characterization of CMOS Programmable Multi-Beam Blanking Arrays as used for Programmable Multi-Beam Projection Lithography and Resistless Nanopatterning", Journal of Micromechanics and Microengineering, vol. 21, Mar. 24, 2011, pp. 1-8.
Li et al., "Through-Silicon Interposer Technology for Heterogeneous Integration", Future Fab International, Issue 45, Apr. 25, 2013, 6 pgs.
Mueller, "Regelbare magnetostatische Linsensysteme fur Elektronenmikroskope—[Variable magnetostatic lens systems for electron microscopes]", Zeitschrift fur Wissenschaftliche Mikroskopie und Furmikroskopische Technik, Hirzel Verlag, Stuttgart, DE, May 31, 1957, vol. 63, No. 5, pp. 303-328, XP009521932.
Palfrader et al., "Computing Mitered Offset Curves Based on Straight Skeletons", Computer-Aided Design & Applications, vol. 12, No. 4, Feb. 11, 2015, pp. 414-424.
Paraskevopoulos et al., "Scalable (24-140 Gbps) Optical Data Link, Well Adapted for Future Maskless Lithography Applications", Proceedings SPIE, vol. 7271, 2009, pp. 11-111.
Platzgummer et al., "eMET—50keV Electron Mask Exposure Tool Development Based on Proven Multi-Beam Projection Technology", Proceedings SPIE, vol. 7823, 2010, pp. 782308-1-782308-12.
Platzgummer et al., "eMET POC: Realization of a Proof-of-Concept 50 keV Electron Multibeam Mask Exposure Tool", Proceedings SPIE, vol. 8166, 2011, pp. 816622-1-816622-7.
Shih, Frank Y. "Image Processing and Mathematical Morphology: Fundamentals and Applications", CRC Press, 2009, pp. 26-32.
Wheeler et al., "Use of Electron Beams in VLSI", G.E.C. Journal of Science and Technology, vol. 48, No. 2, 1982, pp. 103-107.
Zhang et al., "Integrated Multi-Electron-Beam Blanker Array for Sub-10-nm Electron Beam Induced Deposition", Journal of Vacuum Science & Technology, vol. B24, No. 6, Nov./Dec. 2006, pp. 2857-2860.
Extended European Search Report for European Application No. 23160722.7, Search completed Nov. 15, 2023, Mailed Nov. 24, 2023, 38 pgs.
Extended European Search Report received for European Application No. 23160724.3, Search completed Nov. 22, 2023, Mailed Dec. 4, 2023, 19 pgs.
Extended European Search Report received for European Application No. 23180357.8, Search completed Dec. 6, 2023, Mailed Jan. 3, 2024, 10 pgs.
Extended European Search Report for European Application No. 24175161.9, Search completed Nov. 4, 2024, Mailed Nov. 15, 2024, 15 pgs.
Hudek et al., "Multi-beam mask writer exposure optimization for EUV mask stacks", The Journal of Micro/Nanopatterning, Materials, and Metrology, vol. 20, No. 4, Oct.-Dec. 2021, pp. 041402-1-041402-18, doi: 10.1117/1.JMM.20.4.041402.
Keil et al., "Determination of best focus and optimum dose for variable shaped e-beam systems by applying the isofocal dose method", Microelectronic Engineering, vol. 85, No. 5-6, May-Jun. 2008, pp. 778-781, doi: 10.1016/j.mee.2008.01.042.
Keil et al., "Resolution and total blur: Correlation and focus dependencies in e-beam lithography", Journal of Vacuum Science and Technology: Part B, vol. 27, No. 6, Nov./Dec. 2009, pp. 2722-2726, doi: 10.1116/1.3246365.
Tanabe et al., "Short-range Electron Backscattering from EUV masks", Proceedings of SPIE, Photomask and Next-Generation Lithography Mask Technology XVII, vol. 7748, Article 774823, 2010, pp. 774823-1-774823-8, doi: 10.1117/12.862641.

* cited by examiner

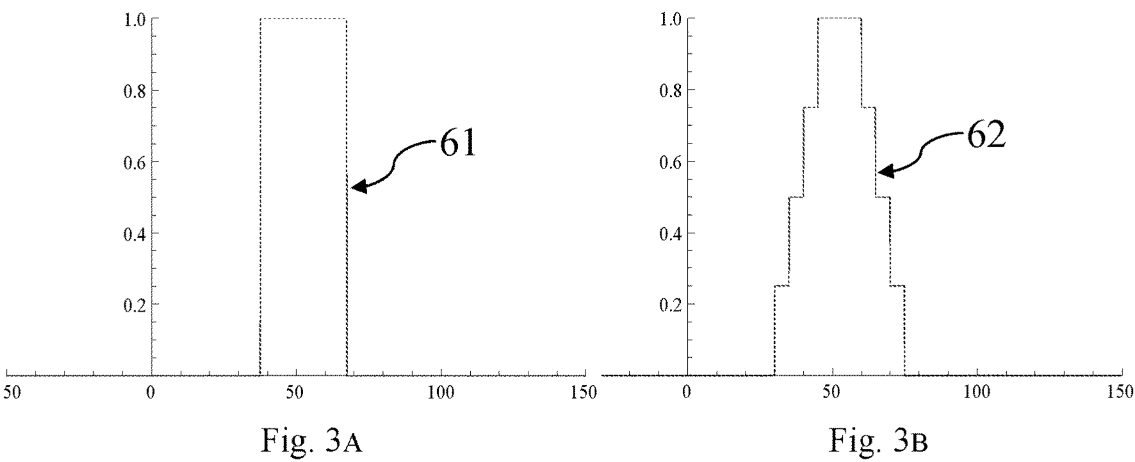
Fig. 3A
Fig. 3B
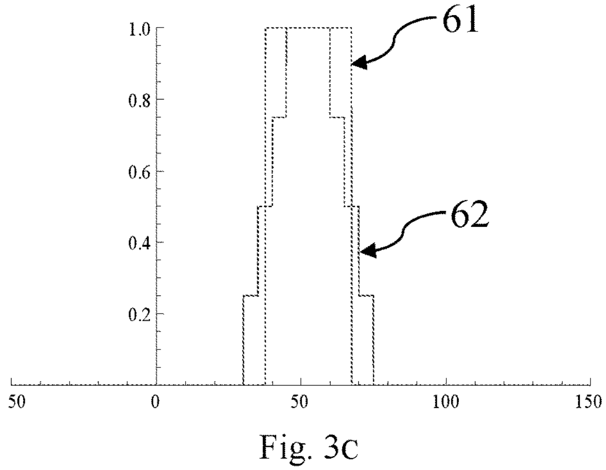
Fig. 3C
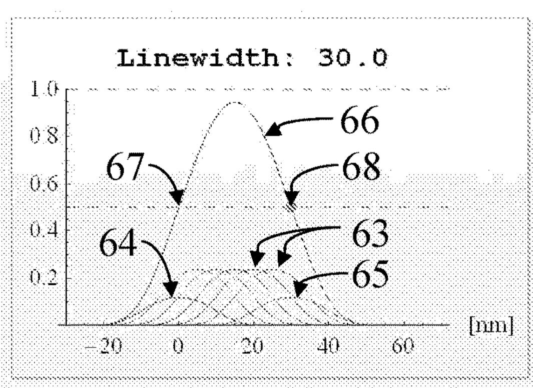
Fig. 3D
(prior art)

METHOD FOR DETERMINING FOCAL PROPERTIES IN A TARGET BEAM FIELD OF A MULTI-BEAM CHARGED-PARTICLE PROCESSING APPARATUS

CROSS REFERENCE TO RELATED APPLICATIONS

This application claims priority to European Patent Application No. 23160723.5 filed Mar. 8, 2023, the disclosure of which is incorporated by reference herein in its entirety.

FIELD OF THE INVENTION

The invention relates to certain improvements in the control of process parameters in a multi-beam charged particle processing apparatus. More specifically, the invention relates to a method for determining focal properties in a target beam field of a charged-particle multi-beam processing apparatus, which is configured for the exposure of a target by means of a structured beam of electrically charged particles.

TECHNICAL BACKGROUND

In a charged-particle multi-beam processing apparatus, a particle beam is generated in a charged-particle source, is directed to and illuminates a pattern definition device comprising an aperture array composed of a multitude of blanking apertures through which the particle beam penetrates, and is then imaged by a projection optics system onto a target, for writing a desired pattern on the target by exposing a multitude of pixels by means of the particle beam impinging on the target within a beam field of the target.

SUMMARY OF THE INVENTION

The above-mentioned aim is met by a method according to the invention as described below, which is carried out in a charged-particle multi-beam processing apparatus comprising: a charged-particle source generating a beam of electrically charged particles; a pattern definition device comprising an aperture array composed of a multitude of blanking apertures, configured to generate a corresponding multitude of beamlets when the beam is directed at and penetrates the pattern definition device; and a projection optics including at least one charged-particle optical lens, and configured to direct the beamlets onto a beam field within a surface of a target provided to the processing apparatus. By virtue of the imaging effected by the projection optics, images of the blanking apertures are projected to the target; the beamlets impinge on the beam field at respective landing positions and with a respective landing angle with respect to the surface of the target, each beamlet forming an aperture image of a respective aperture at a respective location on, or more correctly close to, the target, where this aperture image can be characterized by at least one focal property, such as a height of focus (which describes the distance of the aperture image from the surface of the target), astigmatic length, and a size of blur along at one direction or multiple directions (with respect to a plane perpendicular to the propagation direction of the beam); and by modifying at least one operating parameter of at least one optical component of the projection optics, it is possible to tilt the landing angles of the beamlets (it will be appreciated the tilting amount and/or tilting direction may vary across the beam field). The method according to the invention will include the steps of

- defining a set of measurement positions in the beam field;
- introducing a shift in at least one operating parameter of an optical component of the projection optics, causing a tilting of the beamlet landing angles;
- determining amounts of displacement of the beamlets at the target surface for these measurement positions as a result of the mentioned shift, and determining the change of landing angles at the target for these measurement positions as a result of the shift;
- generating a spatially variable map (where, conceptually, the map will cover the range of the beam field), which describes a mapping from the change of landing angles to the amounts of displacement as a function of the position within the beam field (it will be appreciated that this map relates to the mapping where the changes [of in particular the landing angles and displacement amounts] are induced by the shift in the respective operating parameter);
- extracting, for a plurality of target positions, one or more focal properties from the map; the target positions will be positions determined in advance, such as for instance the nominal locations of the beamlets in the target beam field (or a representative subset of the beamlets).

This method provides an effective way for determining the focal properties across the imagefield, which further allows exploiting the maps and focal properties thus determined for controlling writing processes carried out in the processing apparatus and, in particular, strongly reducing the imaging aberrations so as to improve the precision of the pattern generated on the target.

Additionally, the method enables the monitoring and thus (partial) control of beamlet blur. Furthermore, it allows to optimally adjust the image plane with respect to a desired blur distribution.

In contrast to US 2022/246388 A1, the present invention determines mappings (e.g. matrices $M(x,y)$ modelling a linear relationship) between changes of angular and spatial distortion $\Delta\alpha(x,y)$ and $\Delta s(x,y)$ induced by a shift in an operating parameter for a multitude of positions $(x,y)$ in the imagefield and extracts focal properties, such as height of focus $Z(x,y)$ and/or astigmatism $A(x,y)$ from said mappings. For a multi-beam writer apparatus like MBMW, this approach has the advantage that the method does not rely on contrast measurements, which are not readily available in a multibeam-writer apparatus, especially in-situ; furthermore, the invention requires that the beam field distortion be determined only at two image planes in order to determine the focal properties and optimal image plane from changes in spatial and angular distortion (rather than probing through a range of possible candidate image planes as in US 2022/246388 A1).

The skilled person will appreciate that the number of operating parameters that are “shifted” will correspond with the number of focal properties. For instance, in one embodiment where shifts in (at least) one suitable operating parameters are introduced, the method will allow to obtain two types of focal properties, for instance the height of focus and astigmatic length, for each target position. In a variant embodiment thereof, shifts in (at least) two suitable operating parameters may be introduced, thus allowing to obtain three focal properties, such as height of focus, astigmatic length, and astigmatism angle (orientation of the astigmatism in the XY-plane). While in the embodiments primarily contemplated herein the focal properties include height of focus and/or astigmatic length, it is worthwhile to note that, depending on the specific implementation, the focal properties that are determined by the method according to the invention may be partially or completely different; thus they may include one or more other properties related to the imagefield, such as Z-location of upper and/or lower focus of astigmatic focus, size of blur, anisotropy of blur, etc., in addition to or replacing height of focus and/or astigmatic length.

The spatially variable map provided for according to the invention describes the mapping between change of landing angles to the amounts of displacement induced by a shift in at least one operating parameter for various positions within the beam field, which allow to describe the behavior of the mapping and the focal properties derived therefrom across the beam field, e.g. by using a suitable interpolation procedure. The map will suitably describe the mapping over an area of the beam field that, preferably, covers the entire beam field, but at least the set of measurement positions. It will also be appreciated that the method can also be used to generate multiple maps, which each relate to a mapping where the changes (of landing angles and displacement amounts) are induced by a shift in a respective operating parameter. In many embodiments, the target position may be chosen such that they coincide with the nominal locations of the beamlets in the beam field (i.e., where they impinge on the target surface) or a representative subset thereof, which subset allows calculation and modeling of the behavior of the map across the beam field with a desired accuracy.

In particular, in many embodiments the map(s) may suitably be realized describing the mapping specifically at each of the set of measurement positions, each of the plurality of target positions, or a union of both. Thus, the step of generating a spatially variable map may generate a map that describes, at each location of the plurality of target positions and/or the set of measurement positions (or a combination or union thereof), a mapping from the change of landing angles to the amounts of displacement at the respective location; and also, the step of extracting focal properties from the map may be made for each location of the plurality of target positions and/or the set of measurement positions (or a combination or union thereof).

Further developments of the invention are as follows.

In many embodiments the map from change of landing angles to the amounts of displacement may be linear. In particular, the map may correspond to multiplication with a factor value (which will depend on location across the beam field), said factor value representing height of focus of the beamlets as a function of the position within the beam field.

For instance, in many embodiments, the spatially variable map may be realized as a matrix and the focal properties are calculated using eigenvalues of said matrix. For instance, in order to extract a height of focus from said map, the mean of the eigenvalues of said matrix may be calculated; similarly, for extracting the value of astigmatism, the width of a range may be determined over which the eigenvalues of said matrix extend (this will, in the case of two eigenvalues, reduce to the difference between the two eigenvalues).

Several embodiments include using an evaluation function which yields an evaluation value as a function of operating parameters and/or on or more quantities selected from the focal properties. For instance, such an evaluation function may offer an efficient tool for determining improved (or "optimal") operating parameters of the projection optics, by finding an extremum of the evaluation function, and determining the improved operating parameters from the values of operating parameters (and/or other selected quantities) where the evaluation function assumes the extremum found. Thus, the parameters of the extremum thus determined and/or the operating parameters at the extremum can be used for suitable adjustment of the optical elements. Furthermore, the generation of a spatially variable map may include fitting a model function of the map to the data of amounts of displacement and change of landing angles. During this it may help circumventing possible calculation issues, where the evaluation function includes additional regularization terms, where a regularization term will include the first and/or second spatial derivatives of the height of focus, astigmatic length, or other values derived from the spatially variable map.

In a further development of the invention, the method may furth include the step of using said beam focal properties to generate a map of the spatially variable blur of the exposure apparatus.

Advantageous examples of operating parameters are voltages of electrode component, typically of the electrostatic type, such as: a voltage of a dipole electrode, in particular of an electrostatic dipole electrode; a multipole voltage of a multipole electrode, which may be provided as a component of the projection optics, for instance; a voltage of a rotationally symmetric lens provided as a component of the projection optics; a voltage of an optical component located between the pattern definition device and the projection optics; a voltage of an optical component located immediately in front of or after the pattern definition device; and a voltage of an optical component located between a condenser lens (which is located between the charged-particle source and the pattern definition device) and the pattern definition device.

Furthermore, in many embodiments, and in particular in relation to one or more tuning voltages of one or more electrostatic components of the projection optics, the method according to the invention may further comprise a step of determining optimal values of operating parameters of the projections optics including one or more tuning voltages, using an evaluation function, such that the variation of the specific quantities over the beam field is minimal or within a predefined reference state. This evaluation function, e.g. sum of variations to be minimized, will be calculated from specific quantities that include at least one of height of focus, of astigmatic length and of blur, but may also include the tilting of the beamlet landing angles and/or amounts of displacement of the beamlets, and/or one or more derivatives thereof with respect to a respective one of the operating parameters. For determining of these optimal values (e.g. optimal voltages) it may be advantageous to use a (computer) simulation of the exposure apparatus. In one further development, the optimal values of the tuning voltages may be determined by the additional steps of: determining fingerprints, each fingerprint representing the change in focal properties for a unit change of a respective operating parameter (such as a tuning voltage); and determining those operating parameter values which optimize the superposition of the determined focal properties and the generated change in focal properties expressed by a linear combination of said fingerprints, with the coefficients representing the changes in tuning voltages. These additional steps may also iterated until a predetermined stopping condition calculated using the increment of operating parameters (in particular tuning voltages) with respect to the previous iteration is reached.

For measuring the tilting of the beamlet landing angles and the amounts of displacement of the beamlets a distortion measurement device located within the multi-beam charged particle exposure apparatus (so-called "in-situ" measurement device) may be used, preferably during or directly before a writing process to the target.

In a further development, the method may be used for correction of the optical system, for instance as follows with respect to a selected one of the focal properties, such as height of focus or astigmatism: averaging the (selected) focal property over the beam field to obtain an averaged value; calculating the difference between a desired value of the focal property and the averaged value; determining a correction to at least one operating parameter which corresponds to said difference; and applying the correction to the at least one operating parameter of the respective optical components

BRIEF DESCRIPTION OF THE DRAWINGS

In the following, the present invention is illustrated by several embodiments described below in more detail with reference to the attached drawings. It is emphasized that the embodiments shown here are of illustrative character and are not to be construed as limiting the scope of the invention. The drawings schematically show:

FIGS. 3A-3D illustrate intensity profiles of the multi-beam mask writer tool, namely, FIG. 3A shows a zero blur intensity profile for a line with 30 nm width, FIG. 3B indicates dose levels of overlapping exposure spots, FIG. 3C is a superposition of the previous two figures, and FIG. 3D shows a simulated intensity profile 66 for a line of 30 nm width;

DETAILED DESCRIPTION OF EMBODIMENTS OF THE INVENTION

The detailed discussion given herein is intended to illustrate the invention and exemplary embodiments thereof, as well as further advantageous developments. It will be evident to the skilled person to freely combine several or all of the embodiments and aspects discussed here as deemed suitable for a specific application of the invention. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly stated otherwise. It will be appreciated that the invention is not restricted to the exemplary embodiments discussed in the following, which are given for illustrative purpose and merely present suitable implementations of the invention.

The applicant has realized charged-particle multi-beam tools of the mentioned type and developed corresponding charged-particle optics, pattern definition (PD) device, and multi-beam writing method, in particular a 50 keV electron multi-beam writer to realize leading-edge complex photomasks for 193 nm immersion lithography, masks for EUV lithography and templates (1× masks) for imprint lithography. The system is called eMET (electron Mask Exposure Tool) or MBMW (multi-beam mask writer) for exposing 6" mask blank substrates. The multi-beam system has been called PML2 (Projection Mask-Less Lithography) for electron beam direct writer (EBDW) applications on Silicon wafer substrates. The multi-beam column and writing method can also be used for multi-beam inspection applications.

Figure 1:
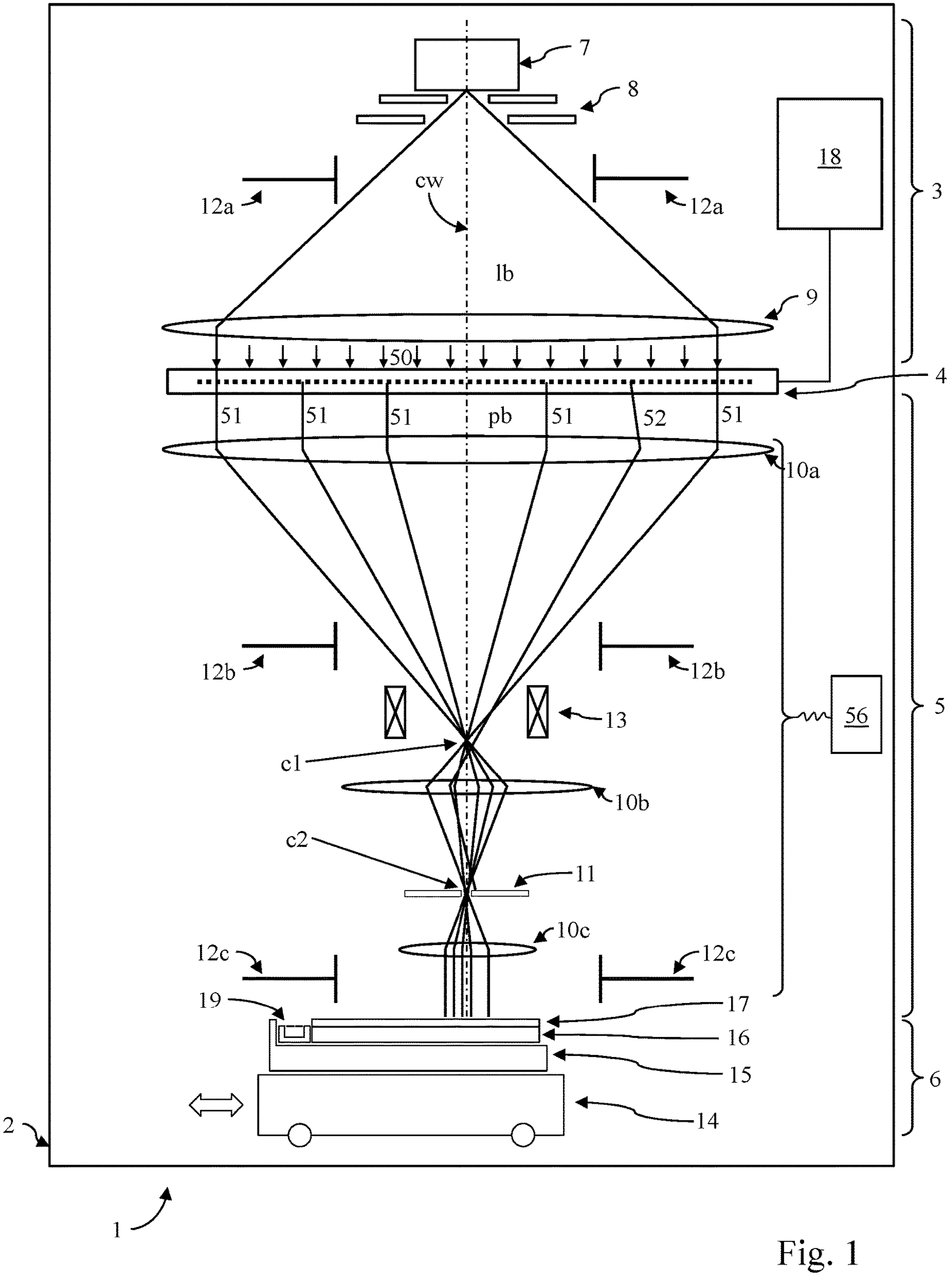
FIG. 1 a charged-particle multi-beam system in a longitudinal sectional view.

Exemplary schematics of the multi-beam writer are shown in FIG. 1. Such a lithographic apparatus is well known in prior art, such as U.S. Pat. No. 6,768,125, EP 2 187 427 A1 (=U.S. Pat. No. 8,222,621) and EP 2 363 875 A1 (=U.S. Pat. No. 8,378,320). In the following, only those details are given as needed to disclose the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3 including the charged-particle source, a pattern definition (PD) system 4, a projecting system 5, and a target station 6 with a substrate 16 serving as target. The whole apparatus 1 is contained in a vacuum housing 2 held at high vacuum to ensure an unimpeded propagation of the beam lb, pb along the optical axis cx of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

Figure 2:
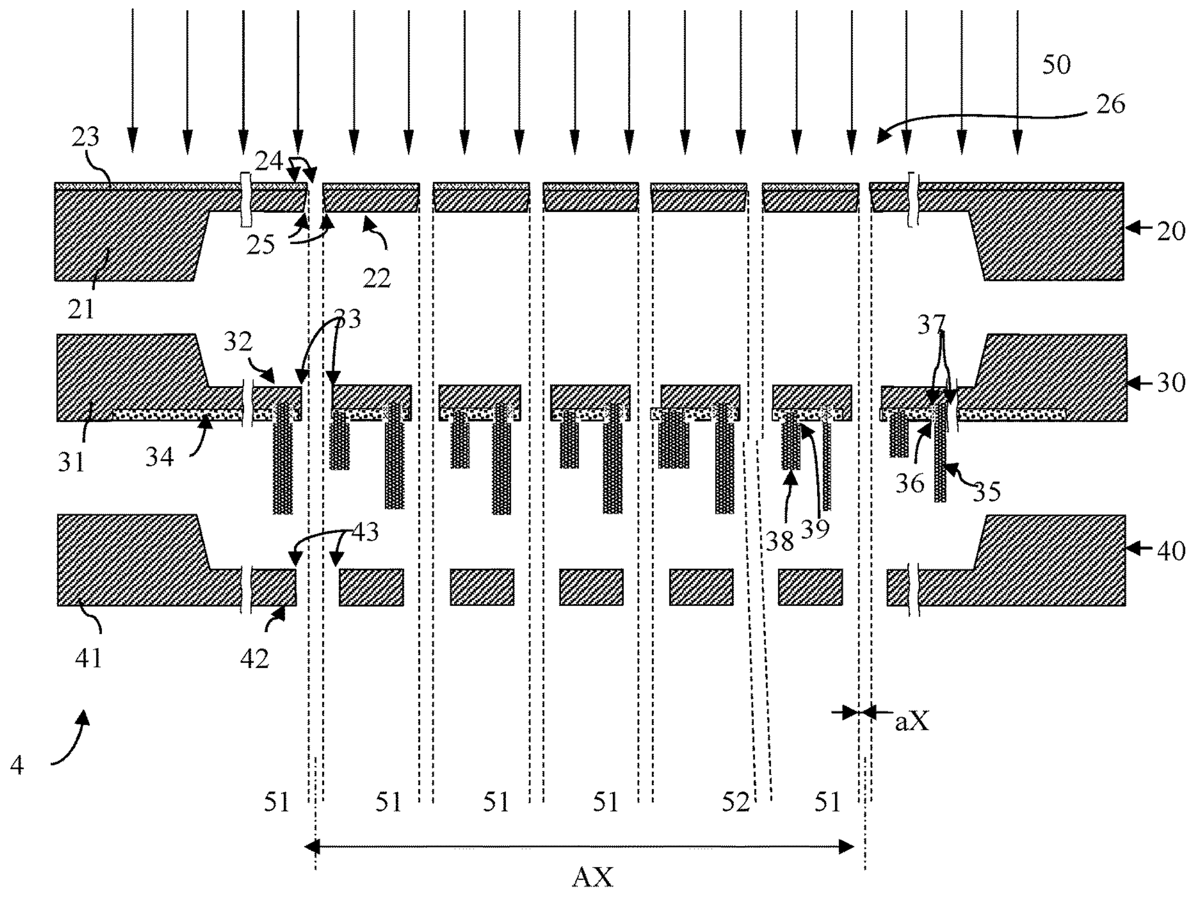
FIG. 2 a pattern definition system of state of the art in a longitudinal section.

The extraction system 8 accelerates the particles to a defined energy of typically several keV, e.g. 5 keV. By means of a condenser lens system 9, the particles emitted from the source 7 are formed into a wide, substantially telecentric particle beam 50 serving as lithography beam lb. The lithography beam lb then irradiates a PD system 4 which comprises a number of plates with a plurality of openings or apertures 24 (FIG. 2). The PD system 4 is held at a specific position in the path of the lithography beam lb, which thus irradiates the plurality of apertures and is split up into a number of beamlets.

Referring to FIG. 2, some of the apertures 24 of the PD system 4 are "switched on" or "open" so as to be transparent to the incident beam in the sense that they allow the portion of the beam (beamlets 51) that is transmitted through it to reach the target; the other apertures are "switched off" or "closed", i.e. the corresponding beamlets 52 cannot reach the target, and thus effectively these apertures and/or openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to a pattern which is to be exposed on the target 16. It has to be noted that the "switching on/off" of the beamlets usually is realized by some sort of deflection means provided in one of the plates of the PD system 4: "Switched off"-beamlets are deflected off their path (by very small angles) so they cannot reach the target but are merely absorbed somewhere in the lithography apparatus, e.g. by an absorbing plate 11.

The pattern as represented by the patterned beam pb is then projected by means of an electro-magneto-optical projection system 5 onto the substrate 16 where it forms an image of the "switched-on" apertures and/or openings. The projection system 5 implements a demagnification of, for instance, 200:1 with two crossovers c1 and c2. The substrate 16 used as target is, for instance, a 6" mask blank or a silicon wafer covered with a particle sensitive resist layer 17. The target is held by a chuck 15 and positioned by a substrate stage 14 of the target station 6. In the following, the terms "substrate" and "target" are used interchangeably, referring to any substrate placed at the target position in the processing apparatus.

The information regarding the pattern to be exposed is supplied to the PD system 4 by a data path realized by means of an electronic pattern information processing system 18 (see also the description of the data path below).

In the embodiment shown in FIG. 1, the projection system 5 is composed of a number of consecutive electro-magneto-optical projector stages 10*a*, 10*b*, 10*c*, consisting of electrostatic and/or magnetic lenses and other deflection means, and is controlled by a projections controller 56, which is, for instance, a dedicated controlling computer or part of an optics controller (not shown) of the entire apparatus 1. These lenses and means are shown in symbolic form only, since their application is well known in the prior art. The projection system 5 employs a demagnifying imaging through crossovers c1, c2. The demagnification factor for both stages is chosen to achieve an overall demagnification of several hundreds, e.g. 200:1. A demagnification of this order is in particular suitable with a lithography setup, in order to alleviate problems of miniaturization in the PD device.

In the whole projection system 5, provisions are made to extensively compensate chromatic and geometric aberrations. As a means to shift the image laterally as a whole, i.e. along a direction perpendicular to the optical axis cx, deflection means 12*a*, 12*b* and 12*c* are provided in the condenser 3 and projection system 5. The deflection means can be realized as, for instance, a multipole electrode system which is positioned near the source extraction system (12*a*), near the first crossover, as shown in FIG. 1 with the deflection means 12*b*, and/or after the final lens 10*c* of the respective projector, as in the case with the stage deflection means 12*c* in FIG. 1. In this apparatus, a multipole electrode arrangement is used as deflection means both for shifting the image in relation to the stage motion and for correction of the imaging system in conjunction with the charged-particle optics alignment system. These deflection means 12*a*, 12*b*, 12*c* are not to be confused with the deflection array means of the PD system 4 which, in conjunction with the stopping plate 11, are used to switch selected beamlets of the patterned beam pd to "on" or "off" state, since the former only deal with the particle beam as a whole. There is also the possibility to rotate the ensemble of programmable beams using a solenoid 13 ("air-coil") providing an axial magnetic field.

As can be seen in the sectional detail of FIG. 2, the PD system 4 preferably comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates, for instance, two movable sub-plates which enable beamlet sizes switchable in-situ, cf. U.S. Pat. No. 8,546,767 by the applicant. The plates are preferably arranged parallel to each other, at mutual distances along the Z direction.

The flat upper surface of AAP 20 forms a defined potential interface to the condenser optics/illumination system 11. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (cf. U.S. Pat. No. 6,858,118). When using electrons or heavy ions (e.g. argon or xenon), the layer 23 may also be of silicon provided by the surface section of 21 and 22, respectively, so that there is no interface between layer 23 and bulk parts 21,22, respectively.

The AAP 20 is provided with a plurality of apertures 24 realized as openings traversing the thinned part 22. In the embodiment shown the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual sub-beams passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to the apertures 24 (by approx. 2 μm at each side for instance). CMOS electronics 34 is used to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding sub-beam, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beams.

The arrangement of a PD system 12 with a DAP 30 having electrodes oriented downstream as shown in FIG. 2 is only one of several possibilities. Further DAP configurations, e.g. with embedded ground and deflection electrodes, can easily be devised by the skilled person (see other patents in the name of the applicant, such as U.S. Pat. No. 8,198,601).

The third plate 40 serving as FAP has a flat surface facing to the first lens part of the downstream demagnifying charged-particle projection optics and thus provides a defined potential interface to the first lens 16*a* of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate thereof, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beams 51 when transmitted through the apertures 24. The beamlets 51 and 52 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beam 52 passing through (FIG. 2). The deflected beam can traverse the DAP and FAP unhindered as the openings 33 and 43, respectively, are made sufficiently wide. However, the deflected beam 52 is filtered out at the stopping plate 15 of the sub-column (FIG. 1). Thus, only those beams which are unaffected by the DAP will reach the target.

The reduction factor of the demagnifying charged-particle optics 5 is chosen suitably in view of the dimensions of the beams and their mutual distance in the PD device 4 and the desired dimensions of the structures at the target. This will allow for micrometer-sized beams at the PD system whereas nanometer-sized beams are projected onto the target.

The ensemble of (unaffected) beams 51 as formed by AAP is projected to the target with a predefined reduction factor R of the projection charged-particle optics. Thus, the ensemble of beamlets is projected to an area of the target surface, hereinafter referred to as "beam array field" or simply "beam field", having widths BX=AX/R and BY=AY/R, respectively, where ΔX and AY denote the sizes of the aperture array field along the X and Y directions, respectively. The beam size of an individual beam at the target is given by bX=aX/R and bY=aY/R, respectively, where aX and aY denote the sizes of the beam 51 as measured along the X and Y directions, respectively, at the level of the DAP 30.

It is worthwhile to note that the individual beams 51, 52 depicted in FIG. 2 are representative of a much larger number of sub-beams, typically many thousands, arranged in a two-dimensional X-Y array.

As a typical implementation of an MBMW, the applicant has realized a 50 keV electron MBMW with charged particle optics providing a reduction factor of R=200 for 512×512 (262,144) programmable beamlets of 20 nm beam size within a beam field of 81.92 μm×81.92 μm at the target, which corresponds to a of 4 μm×4 μm opening size in the aperture array plate (AAP). For the realized writer system the target is, e.g., a substrate realized by a 6" mask blank (area: 6"×6"=152.4 mm×152.4 mm, thickness: 1"/4=6.35 mm) covered with an electron beam sensitive resist. Furthermore, in the realized system of the applicant multi-beam writing is possible on resist covered 150 mm Si wafers.

The first generation MBMW production tools are targeted to use 20 nm and 10 nm beams providing up to approx. 1 μA current for all 262,144 programmable beams "on". For following generations of MBMW production tools there is the plan to use even smaller beam size of e.g. 8 nm and concurrently to provide e.g. 640×640=409,600 beamlets within the 81.92 μm×81.92 μm beam field at the target.

In the preferred multi-beam writing method proposed by the applicant the exposed spot size matches the beamlet size, e.g. 20 nm, and includes an overlap between the spots, with a selected amount of overlap. In the "Double Grid" multi-beam exposure, the overlap between the spots is half of the beam size in X as well as in Y direction. In the "Quad Grid"

multi-beam exposure, the overlap between the spots is a quarter of the beam size in X as well as in Y direction. The spot size at the target is aX/R where aX is the opening width of the apertures in the aperture array plate (FIG. 2) and R is the reduction factor of the charged-particle projection optics. Each spot is exposed with discrete dose levels. For instance, when using 4 bits for programming the dose levels, the dose level of each spot can be selected to be 0, 1, 2, . . . 14, or 15 units.

In FIG. 3A, an illustration for the case of a zero beam blur, the ideal intensity profile 61 is shown for a line with 30 nm width. When using "Quad Grid" multi-beam exposure, the overlap is a quarter of the beam size. Thus, for the case of using 20 nm beam size the physical grid size is 5 nm. A discrete dose level can be assigned to each physical grid area, which is 5 nm×5 nm for the example shown, and in FIG. 3B the discrete dose levels 62 applied for generating the 30 nm line are indicated. FIG. 3C shows the superposition of the zero blur intensity profile 61 (FIG. 3A) and the dose level histogram 62 (FIG. 3B). In the general case the dose level histogram will not be symmetrical in order to position the left and right edge at predefined positions. In FIG. 3D a simulation is shown for a line of 30.0 nm width with the left edge to be positioned at 0.0 nm and the right edge at 30.0 nm. For the simulation, exposure of 20 nm beam spots with a 1sigma blur of 5.1 nm (12.0 nm FWHM blur) was assumed. The intensity profile 66 is formed by overlapping exposure spots 63, 64, and 65. The dose level of the leftmost exposure spot 64 is adjusted such that the 30 nm line starts at position 67, i.e. the desired 0.0 nm position. The dose level of the rightmost exposure spot 65 is adjusted such that exposed line ends at 68 with 30.0 nm width. As shown in FIG. 3D, the overlap of the 20 nm exposure spots 63, 64, 65 is a quarter of the beam size, i.e. 5 nm ("Quad Grid").

Figures 4A, 4B:
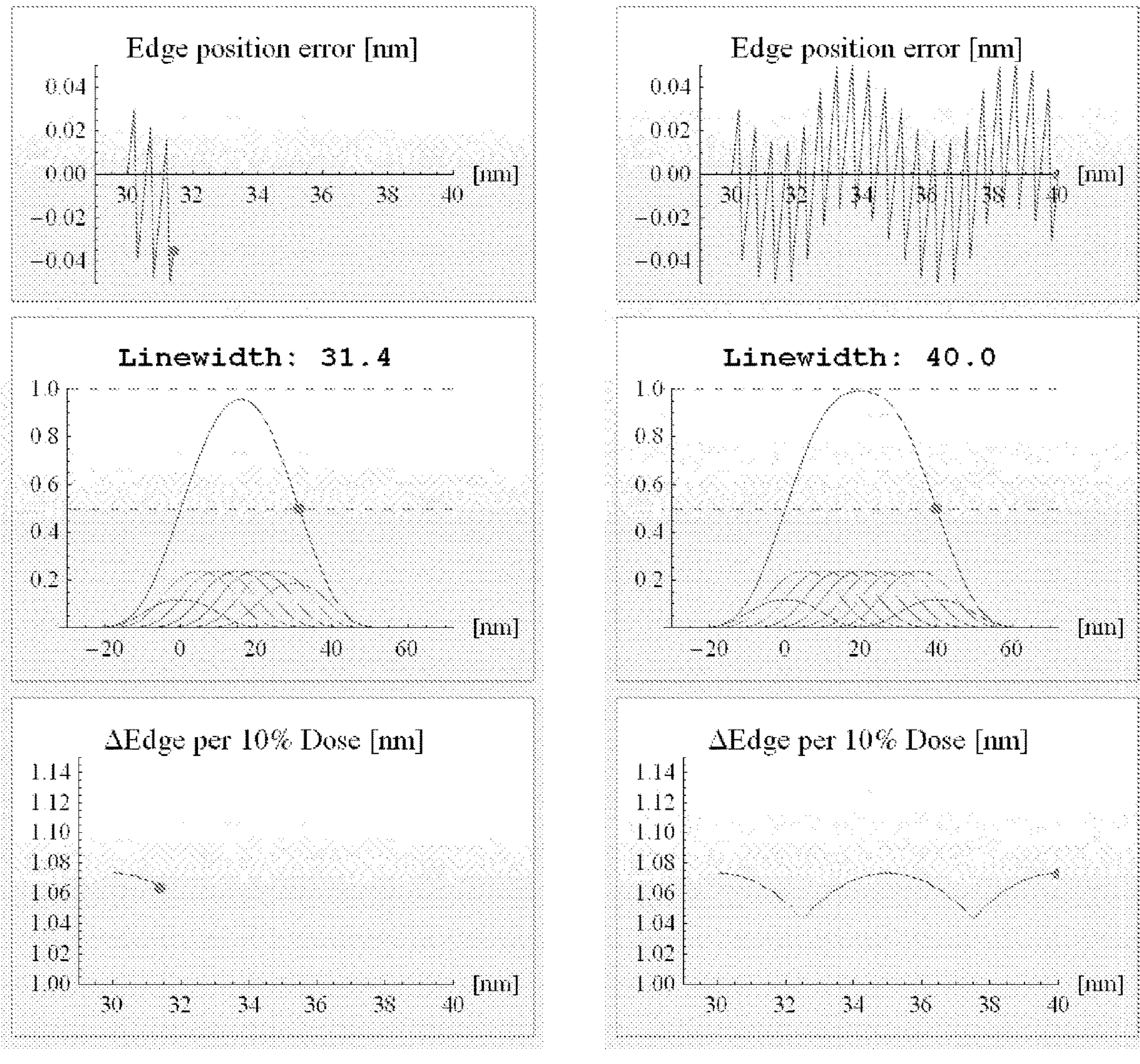
FIG. 4 shows multi-beam writer intensity profiles and related data as obtained for simulations of lines with a line width of 31.4 nm (FIG. 4A) and 40.0 nm (FIG. 4B), respectively.

Using the multi-beam exposure tool with 20 nm beam size and Quad Grid exposure (5 nm physical grid size), the line width can be changed in steps of 0.1 nm. As examples, FIG. 4A shows the intensity profile for 31.4 nm line width and FIG. 4B for 40.0 nm line width. Because of the integer dose levels there are slight deviations from the 0.1 nm address grid. These deviations are indicated as "edge position error" in the upper parts of FIG. 4A and FIG. 4B, as functions of the desired line width, in 0.1 nm steps between 30.0 nm and 40.0 nm. As can be seen the deviations are within +0.05 nm. Furthermore, the changes of edge position with 10% change of dose, as shown in the lower parts of FIG. 4A and FIG. 4B, are approx. 1 nm, varying only slightly for different line widths. In other words, since the dose is controlled in a multi-beam writer tool of the applicant to better than 1%, there is only approx. 0.1 nm change of edge position with 1% change of dose.

In the beam field, each beamlet is focused to form an image of the respective aperture of the AAP, and thus the apertures of the AAP are imaged into an "imagefield", which is formed on or close to the target surface. In other words, the aperture array of the AAP is focused into this "imagefield". For each beamlet, the aperture image will be located at a certain distance (measured along the Z direction) from the target, referred to as "height of focus". (The height of focus is measured as the distance from the target surface against the Z direction, so locations above the target are denoted as having a positive height of focus.) An ideal projection system would focus the imagefield exactly on the target surface at the target beam field, but in realistic implementations, as a consequence of non-ideal imaging, the imagefield will be curved slightly, usually being concave as seen from the AAP (cf. FIG. 7), so a beamlet towards the border of the imagefield is focused at a height of focus that is generally larger than for a beamlet in the center of the imagefield. It is worthwhile to note that a projection system of an operational multi-beam tool is configured to generate an imagefield where the height of focus is very small, and at least small compared to the longitudinal dimensions of the optical system, which justifies the expression "close to the target surface". Furthermore, there may be small lateral displacements of the beamlets, such that the positions of aperture images within the beam array field is shifted laterally with respect to their nominal positions, and the direction and amount of this shift will vary across the imagefield; this effect is hereinafter referred to as "beam field distortion" or "imagefield distortion".

As an additional complication in the imagefield there may be astigmatism, in that the position of focus is also slightly dependent on the lateral direction (in the XY-plane) of contributing rays in the beamlet; more exactly, there are two main directions (in the XY plane) where focusing is exact, but at slightly different Z positions. In this case the "height of focus" is defined as the average of these two Z positions; corresponding to the height of "least confusion"; the difference of these two Z positions is called the amount of astigmatism or the "astigmatic length". Hereinafter, the term "imagefield focus" may be used as a shorthand to refer to both quantities of height of focus and astigmatic length. Both imagefield curvature and astigmatism often lead to a non-uniform distribution of beamlet blur (which may additionally be anisotropic) across the beam field.

The mentioned imaging defects in the imagefield curvature, and in particular the imagefield distortion, may impair the precise rendition of the pattern to be written on the substrate that serves as target. The inventors found that typical errors of the location caused by these imaging defects may be as large as several nm.

The document US 2022/246388 A1 describes a method for determining and setting a focal plane in a multi-beam microscope, using measurements of contrast curves of partial images to determine "best focal positions"; it also proposes evaluating a telecentricity error of the multi-beam microscope from measurement of lateral offsets of image data and beam angles, but does not describe how these data can be used for calculation of astigmatic length of the individual beams.

Therefore, it is an aim of the present invention to present approaches for determining of focal properties of the imagefield in order to better detect the presence and amounts of imaging defects of the imagefield Charged-particle multi-beam tools which are suitable for implementing the invention are described above with reference to FIGS. 1 to 4B. Further details about multi-beam charged-particle tools can be found in U.S. Pat. Nos. 9,520,268, 6,768,125, EP 2 187 427 A1 and EP 2 363 875 A1 and references cited therein, which are all herewith included by reference as part of the disclosure.

Distortion of the Beam Array Field

The charged particle projection system 5 is subject to a variety of imaging error sources, including, for instance, spherical aberration of the electromagnetic lenses, misalignment of elements of the projection system, charge deposition to components of the pattern definition system 4 and/or components of the projection system 5. These imaging errors cause a shift (spatial displacement) of the impact position of the beamlets at the target, typically in the order of several nm. The amount and direction of this shift will, in general, vary within the beam field; the effect of beamlet position shifts within the beam field is hereinafter referred to as "spatial distortion", which represent the main component of the beam field distortion mentioned earlier.

Furthermore, in realistic implementations of a projection system underlying the invention, the beamlets strike the target with small but significant residual angles (typically in the order of several mrad at the target) with respect to the ideal telecentric landing angle; this effect is hereinafter denoted "angular distortion". Since the beam will usually not remain perfectly focused during exposure (e.g. due to beam current fluctuations or variations of substrate surface height), angular distortion may generate additional spatial contributions to the beam field distortion (in the order of several nm).

Spatial distortion of the imagefield can be measured, for instance, by means of state-of-the-art registration metrology tools (e.g. LMS IPRO™) or in-situ metrology targets. Angular distortion, on the other hand, may be determined by measuring spatial distortion for two distinct (intentionally shifted) image planes and dividing the measurement difference by the shift amount (using the small angle approximation).

In FIG. 1, a distortion measurement device 19 is depicted symbolically beside the target 16. Measuring spatial distortion of the beam array field is possible, e.g., using state-of-the-art registration metrology tools (e.g. LMS IPRO™) or in-situ metrology targets. Angular distortion, on the other hand, may be determined by measuring spatial distortion for two distinct (intentionally shifted) image planes which are at a defined distance in the Z-direction to each other, and dividing the measurement difference by this distance in the Z-direction (using the small angle approximation).

Generally, any tool for measuring the position of one or more beamlets may be adapted as a distortion measurement device. For instance U.S. Pat. No. 7,772,574 (=WO 2006/053358 A1) of the applicant describes a detection unit for detecting the position of a composite reference beamlet at the intermediate image position. This detection unit can be directly adapted for detecting the position of a regular beamlet at the final image position; the plurality of sub-beamlets of the reference beamlets (shown as hatched rectangles in FIGS. 14 and 15 of U.S. Pat. No. 7,772,574) can be simulated by a time-controlled variation of the regular beamlet position over a plurality of positions of the pads of the detection unit, by stepping the beamlet through a sequence of positions along the respective direction in the X-Y-plane by means of a multipole electrode. In order to realize the measurement at two different image planes (different Z-positions), the detection unit may be shifted along the Z-direction using a mechanical displacement, or two detection units are arranged with a defined relative offset along the Z-direction. Multiple copies of such a detection unit may be used to realize measurement of several beamlets and along different directions in the X-Y-plane.

Figure 20:
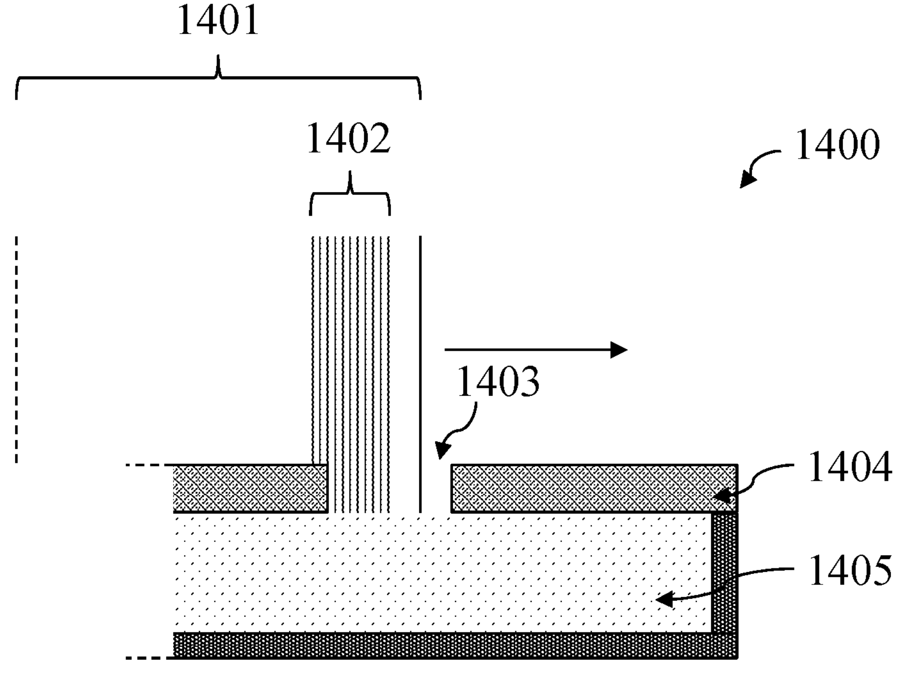
FIG. 20 shows an in-situ operating calibration target in a longitudinal sectional view.
Figure 21:
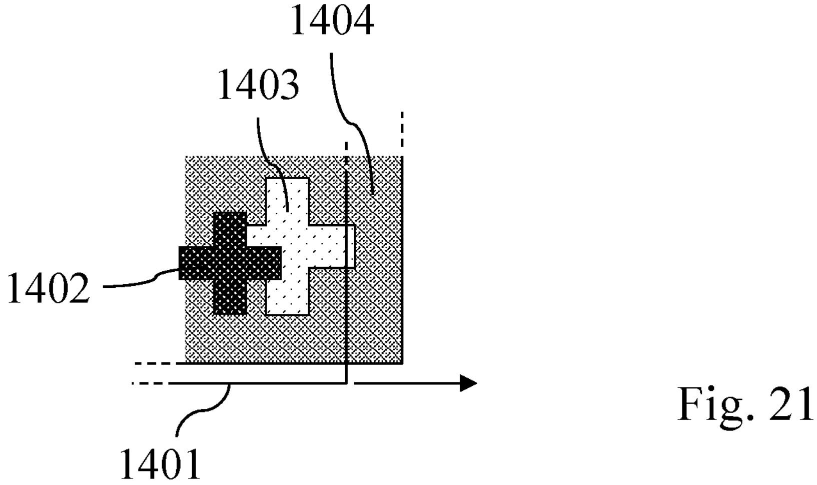
FIG. 21 shows a top view of the calibration target of FIG. 20.

One preferred method for measuring the distortion in-situ is illustrated with reference to FIGS. 20 and 21. Herein, "in-situ" means that the measurement is done near the plane of the target, for instance at the position of the target or a position adjacent thereto, during or immediately before the writing process on a the substrate at the target position, thus avoiding an intervening development process of a test substrate. One example of a calibration target, which is based on the well-known Faraday cup, is illustrated in a longitudinal sectional view depicted in FIG. 20 and a top view shown in FIG. 21. The calibration target 1400 includes a Faraday cup 1405 which is covered by a metal plate 1404 provided with cutouts 1403 according to a suitable pattern, which pattern is arranged covering the area of an imagefield. For instance, as can be seen in FIG. 21, the pattern may be realized as one cross-shaped cutout feature 1403, or the pattern may include a plurality of such cutouts (not shown). Each cutout 1403 is then scanned with a subset 1402 of the beam array 1401, where the subset 1402 is chosen suitably so as to match the shape of the cutout 1402. During the scan the current in the Faraday cup is measured; this current will be maximal when the position of the beam array subset 1402 exactly coincides with the position of the cutout 1403. The scan can suitably be accomplished by continuously changing the voltage applied to an electron-optical element, creating a dipole operation, and calculating the distance covered from its voltage sensitivity. The same is done for the perpendicular direction and it is repeated for different matching beam array subsets, for instance for 6 by 6 crosses positioned on a grid covering the imagefield (not shown). This allows to calculate the relative spatial distortions at these 6 by 6 sample point and thus obtain a beam field distortion sample. Based on this determination of the spatial distortion, in a next step, the angular distortion can, as mentioned earlier, be calculated by intentionally shifting the image plane by a suitable chosen value of Z shift, and repeating the measurement of spatial distortion conducting a second measurement in this intentionally shifted imageplane; then, using both results of different Z image planes enables calculating the angle from the imageplane Z shift and the difference in spatial distortions.

Figure 5:
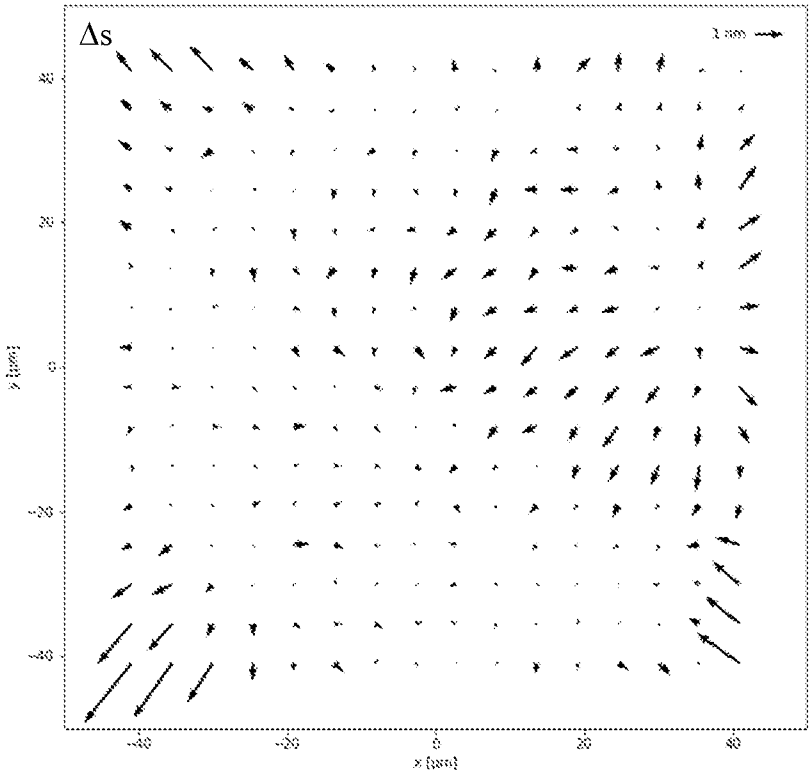
FIG. 5 shows an example of a beam field distortion, with the upper frame showing the spatial distortion part $\Delta s$ and the lower frame showing the angular distortion part $\Delta\alpha$ of the beam field distortion.
Figure 5:
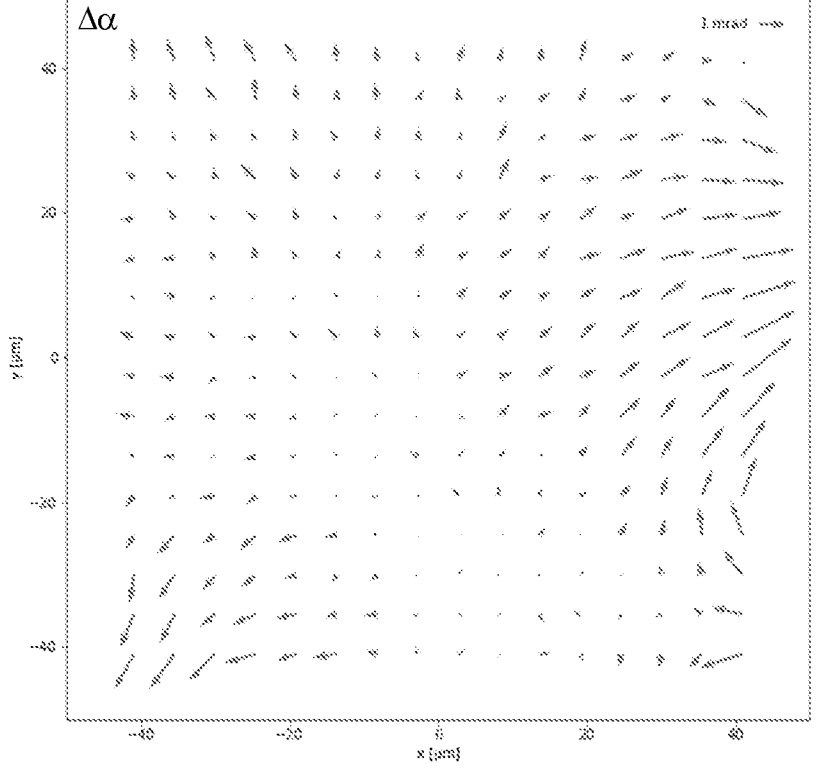

FIG. 5 presents an illustrative example of an imagefield distortion combining spatial and angular distortion (without/before a correction according to the invention), for a beamlet field size of around 80 μm at the target, as implemented by the applicant in the MBMW, which represents one favored embodiment of the invention as discussed below. The spatial distortion Δs is depicted in the upper frame FIG. 5, where the black arrows indicate the beamlet displacement; and the lower frame illustrates the angular distortion Δs with the gray arrows indicating the direction in which the beamlet is tilted. The inventors noted that, as also visible in the examples of FIG. 5, the variation of both angular distortion and spatial distortion over the beam field is typically reproducible and contains systematic error-components, which can be reduced by properly adjusting the projection system.

Adjustment of the Projection System

The projection system 5 includes components which can be used for largely reducing the distortion of the imagefield. For instance, a variety of steering multi-poles with individually adjustable electrodes may be provided, preferably located close to the electrostatic and magnetic lenses. The multi-pole electrodes in the current implementation of the MBMW, for example, may consist of up to 12 poles, and can hence apply 12 independent multi-pole fields up to "dodecapole" order.

Figures 6A, 6B, 6C, 6D, 6E, 6F:
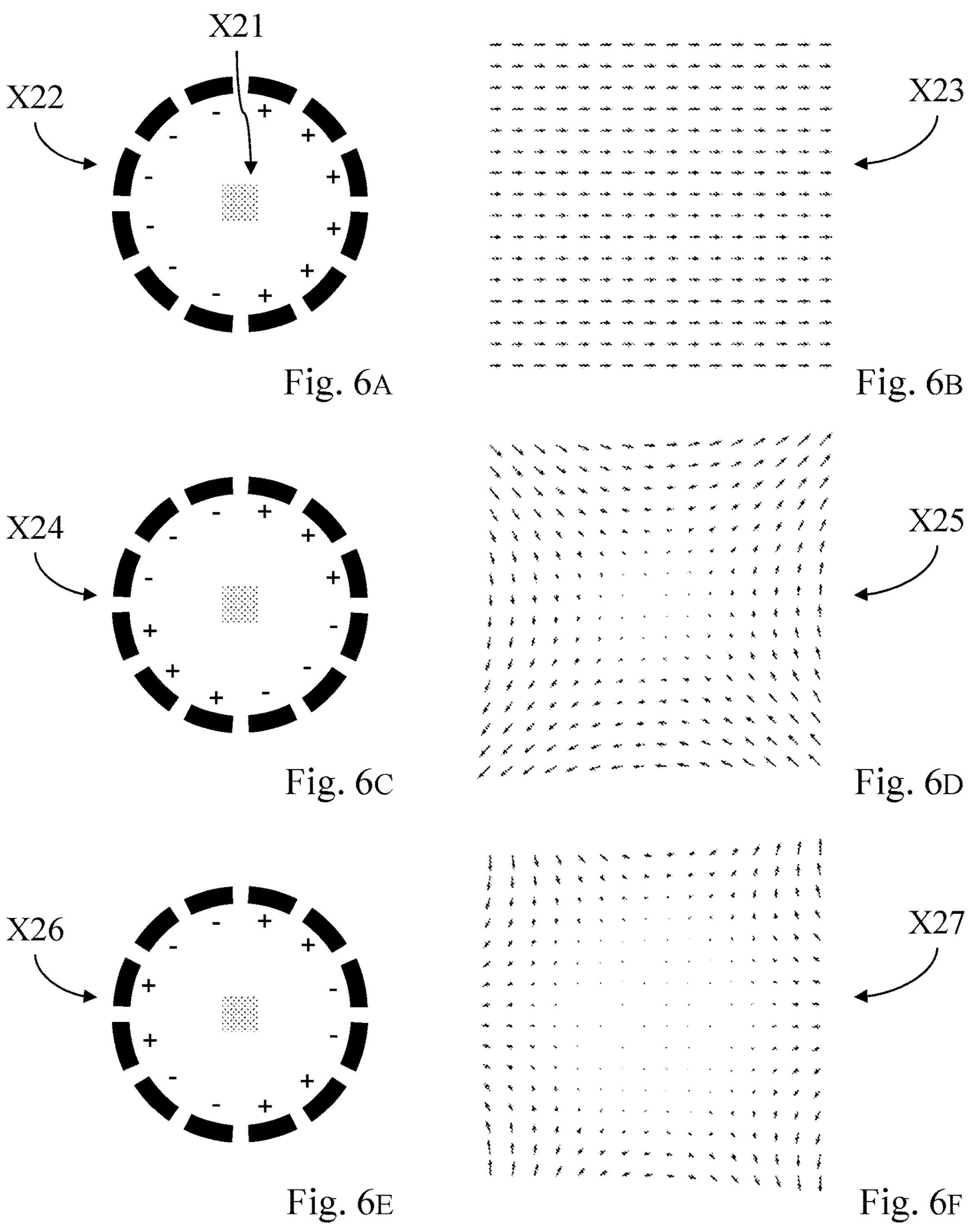
FIGS. 6A to 6F illustrate the use of a multi-pole electrode assembly to generate multipole fields (FIGS. 6A, 60, 6E) and associated spatial variations in the imagefield (FIGS. 6B, 6D, 6F), respectively.

In FIGS. 6A to 6F, an exemplary multi-pole electrode assembly with 12 electrodes (as seen along the optical axis) and three examples of multi-pole fields it can generate are depicted schematically. As illustrated in FIGS. 6A and 6B, a dipole configuration X22 generates a dipole field X23 in the beamlet field X21; such a dipole field is mainly used for shifting and tilting the beamlets. Higher-order multipoles such as a quadrupole configuration X24 with corresponding field X25, as illustrated in FIGS. 6*c* and 6D, and a hexapole configuration X26 with corresponding field X27, as illustrated in FIGS. 6E and 6F, may suitably be used for beam-shaping and distortion correction. Higher orders of multipole can be included to effect more elaborate corrections of spatial variations of the distortions.

Also, other components of the projection system may be used to reduce the imagefield distortion by suitable optimization of operating parameters associated with such other components such as the condenser lens system 9 and the electro-magneto-optical projector stages 10*a*, 10*b*, 10*c* (or, in the case the projector stages consist of multiple consecutive electrodes, one or more of these electrodes).

The operation of the particle-optical system, and in particular the projection system, is controlled in the controller 56 by controlling a number of operating parameters of particle-optical components of the particle-optical system, in particular the (electrostatic) voltages of selected electrostatic electrodes; there may be, depending on the individual implementation, other types of operating parameters as well, such as feeding currents of magnetic coils of magnet lenses, positions of spatially adjustable components, ratios between voltages within a multipole electrode, controllable environmental parameters such as pressure or temperature, etc.

For the purpose of this invention, all elements of the projection system that can be modulated for distortion optimization or general adjustment of the projection system 5 represent elements that may be selected for optimization of optical imaging properties, hereinafter referred to as "electron-optical optimization elements". This need not encompass all components of the projection system 5, nor all degrees of freedom of the multipole electrodes, all the more since some degrees may be used for other purposes. Lens voltages, for instance, may have to be fixed to ensure a constant reduction factor, and dipoles of the multipole steering electrodes may be utilized to ensure correct alignment of the beam through electrostatic or magnetic lenses. Furthermore, some elements may be used to perform redundant operations to reduce the imagefield distortion. Typically, however, at least two multi-pole steering electrodes are involved.

A typical set of electron-optical optimization elements includes, for instance:

- lens electrode (for scaling)
- magnetic coil (for rotation)
- multi-pole-operations of several 12-electrode multipoles (for further beam shaping): 1 scale-operation, 2 dipoles, 2 quadrupoles, 2 hexapoles, 2 octupoles, 2 decapoles and 1 dodecapole each.

Imagefield Topography

When modulating the operating parameter of an optical element, such as the voltage of an electrostatic electrode, the generated changes in angular and spatial distortion (referred to as angular and spatial "displacements") are correlated. Such a correlation may be modelled as a so-called "imagefield focus map" or "imagefield topography map". Maps of this kind may serve two purposes within the present invention; firstly, they can be used to reduce the number of measurements when characterizing the effect of optical elements on the spatial or angular distortion, and secondly, they can be used to analyze and optimize the imagefield focal properties of the exposure apparatus, which is an important aspect of this invention. Herein, the term "focal properties" is used to refer to the parameters of the imagefield focus at or close to the target varying across the imagefield.

It is worthwhile to note that for optical elements that are located in front of, or at, the pattern definition device 4 (as seen along the direction of the optical axis, i.e., from the charged particle source towards the target), in other words "pre-object", any changes to the angles of the beam array will not affect the position of the beamlets at their respective focus point. Across the imagefield, the foci of the beamlets form a curved image surface (of the projection system 5).

Figures 7, 8:
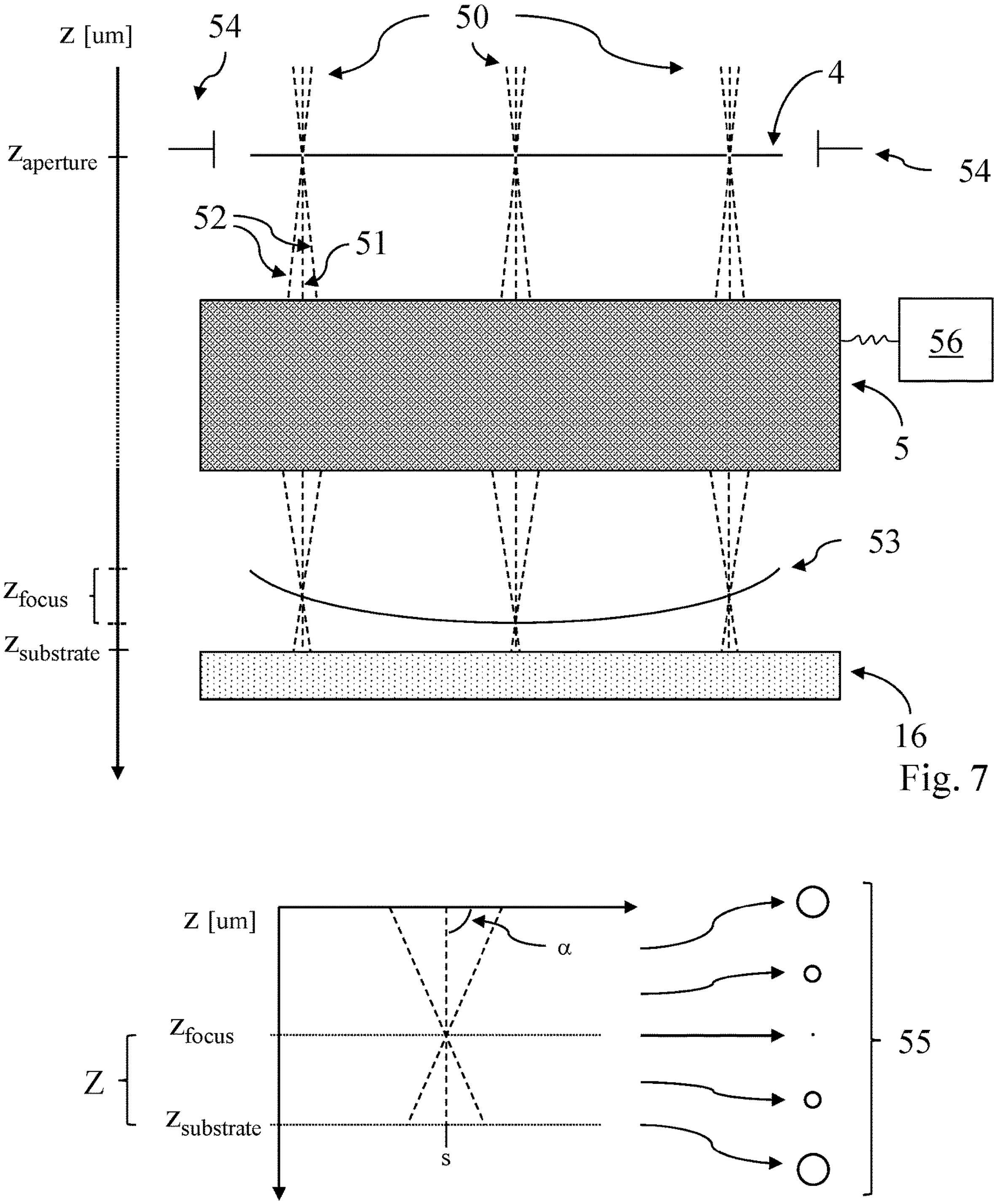
FIGS. 7 and 8 illustrate the effect of beam divergence of the beamlets generated at the pattern definition device, with FIG. 7 depicting the propagation of (three exemplary) beamlets through the pattern definition device and projection optics, and FIG. 8 showing a detail of one the beamlets at its landing location on the target and the blur figures at different heights above the target plane.

One simple embodiment of the concept underlying the invention is illustrated in FIGS. 7 to 10. Referring to FIG. 7, electrons that originate from the illumination system 3 and pass through the pattern definition device 4 form beamlets 50 at each aperture (in these drawings, for simplicity, only three apertures and corresponding three beamlets are shown, and the lateral size of the apertures is neglected). The particles in each beamlet have probabilistically distributed residual angles (which are drastically exaggerated for illustration purposes—typically, residual angles are in order of 50 μrad). In the drawings, representative beamlet rays are symbolically indicated as dashed lines starting from the respective position of the aperture, namely, a central ray 51, as well as angled outer rays 52, which represent, e.g., a 3-sigma-envelope for normally distributed beamlet angles. After passing through the projection optics 5, the beamlets 50 are focused close to the target 16 at the image surface 53. The image surface 53 is typically curved due to spherical aberration of the electromagnetic lenses comprised in the projection optics (again, this is largely exaggerated in the drawings). As can be seen in FIG. 8 for one beamlet which has its incidence at a landing position s at the target 16 with a nominal beamlet angle α (in this example, the beamlet angle α=0° with respect to the vertical axis, but it may have a finite value depending on the actual implementation), the residual angles are manifested as blur which depends both on the width of the angular distribution of the beamlet ("numerical aperture") and its relative focus distance $z_{focus}-z_{substrate}$ to the target surface. In this model, if the angular distribution is isotropic, the resulting blur spots 55 will be circular.

Figure 9:
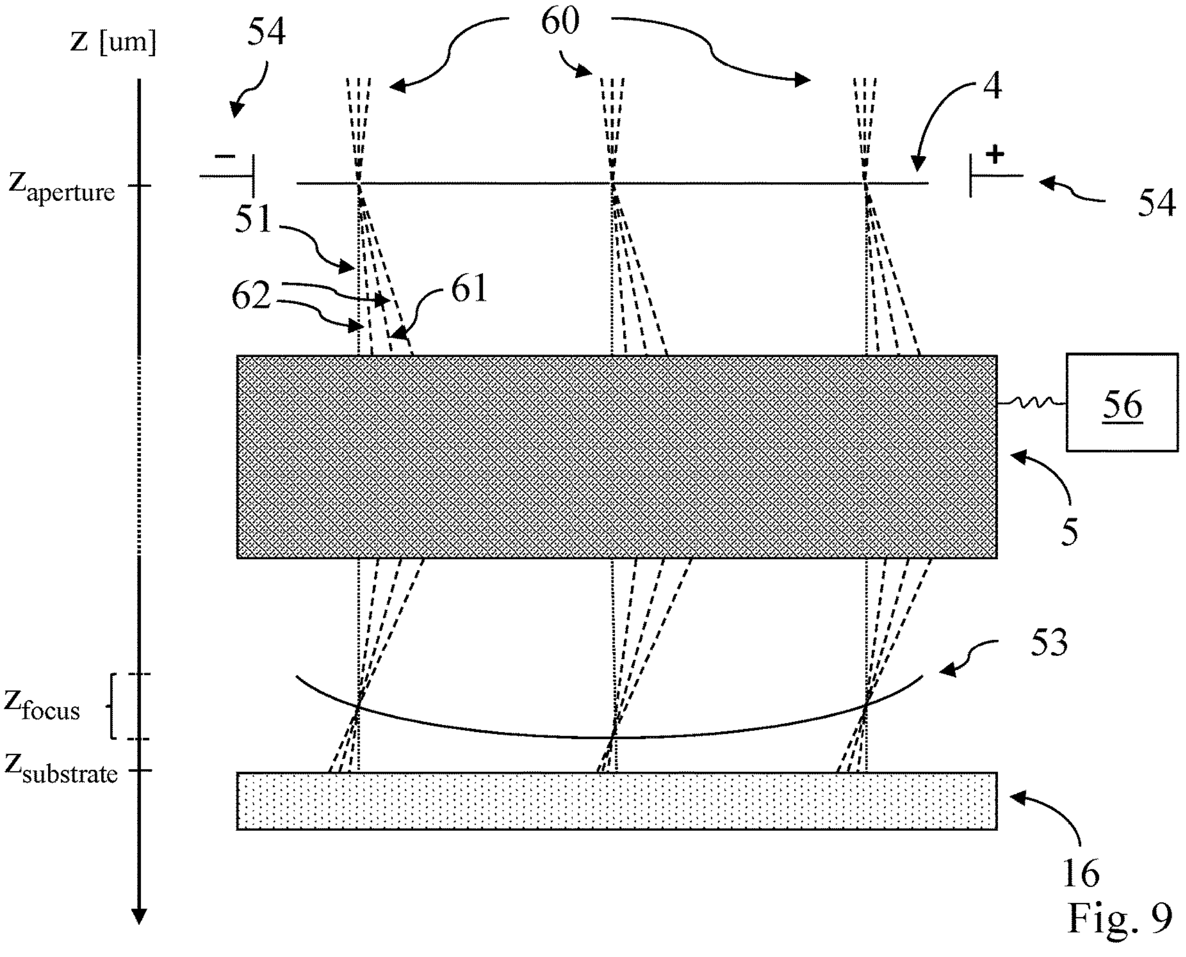
FIGS. 9 and 10 illustrate the effect of beam divergence of the beamlets generated at the pattern definition device, where also a tilt of the beamlets is introduced, with FIG. 9 depicting the propagation of (three exemplary) tilted beamlets through the pattern definition device and projection optics, and FIG. 10 showing a detail of one the tilted beamlets at its landing location on the target.
Figure 10:
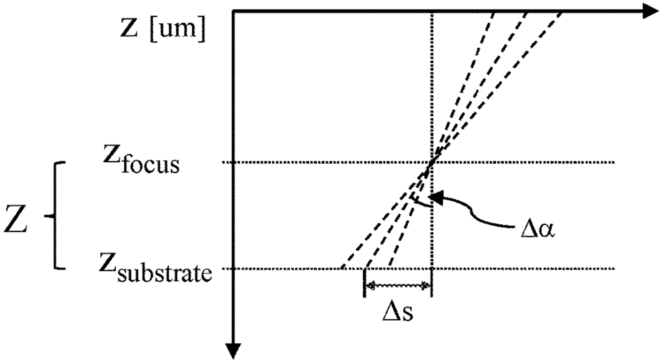

FIGS. 9 and 10 illustrate the effect of tilting the beamlets. If a beamlet 60 (with central ray 61 and angular spread 62) is tilted by a small amount relative to the unperturbed direction 51 (shown as vertical full line) by a deflection means 54 located above or at the pattern definition device (realized, for example, by a multi-pole electrode applying a dipole field or a suitable modulation of electrostatic fields within the illumination system), the projection system will focus the beamlets onto the image surface 53, which will not change significantly. As shown in FIG. 10, the change of angle Δα leads to a beamlet position shifted by Δs relative to the landing position s with unadjusted beamlet angle α. By measuring Δs and Δα and using the small-angle paraxial approximation tan(α)≈α, the relative focus $$Z := z_{focus} - z_{substrate} \approx \frac{\Delta s}{\Delta \alpha}$$

can be determined for each beamlet (or position in the beam field), to obtain the map Z(x,y) of the imagefield curvature 53 measured relative to the target surface.

Conversely, for a given change (relative to a reference state) in angular distortion Δα(x,y) introduced with a pre-object optical element, the imagefield focus map can be used to predict the generated spatial displacement Δs(x,y) via $$\Delta s \approx Z\Delta\alpha$$

or vice versa. The same holds, mutatis mutandis, for the angular and spatial distortion fingerprints of the optical element (see below for an explanation of fingerprints).

Figure 11:
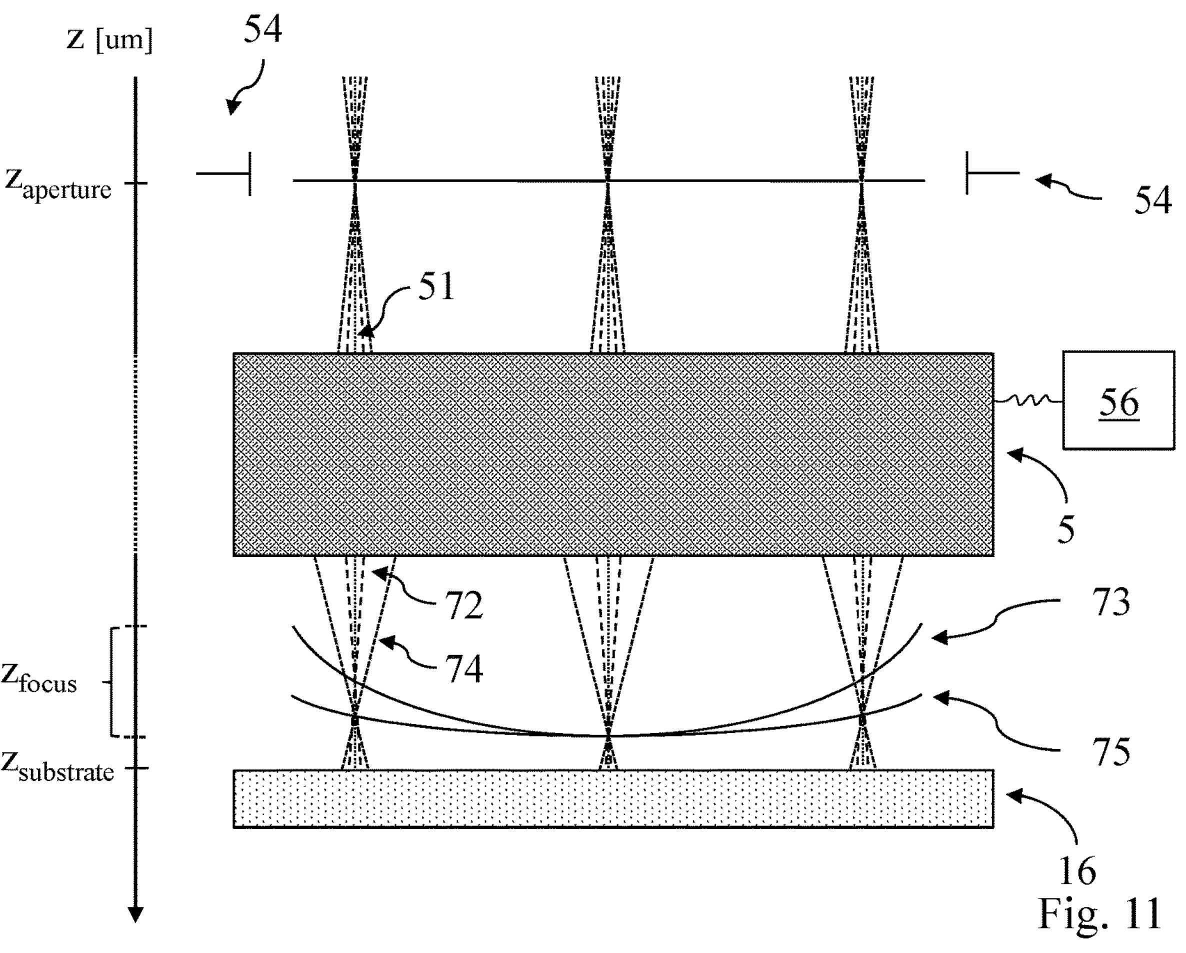
FIGS. 11 and 12 illustrate the effect of astigmatic beam divergence of the beamlets generated at the pattern definition device, with FIG. 11 depicting the propagation of (three exemplary) beamlets through the pattern definition device and projection optics with astigmatic focus, and FIG. 11 showing a detail of one the beamlets at its landing location on the target and the blur figures arising from such stigmatism.
Figure 12:
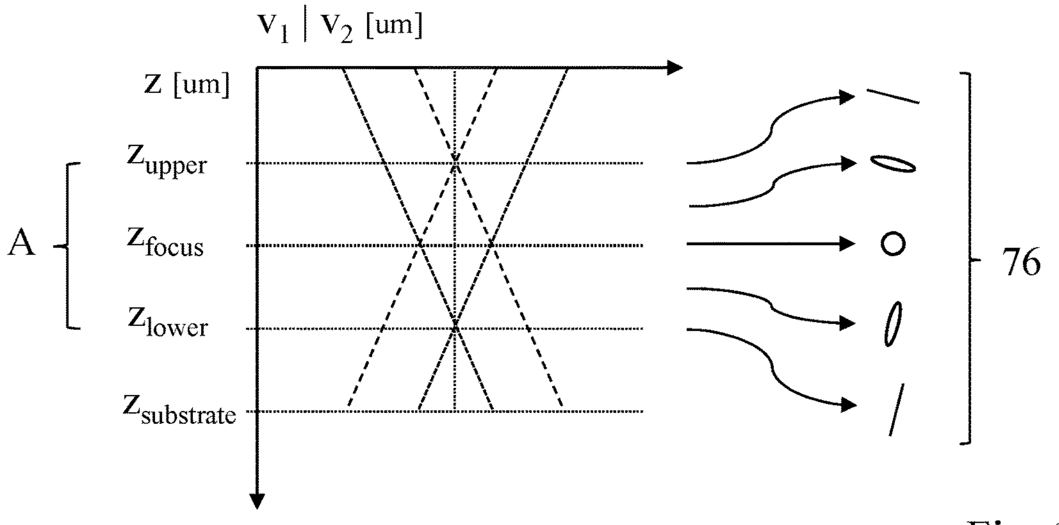

Referring to FIGS. 11 and 12, in a favorable embodiment of the invention, not only imagefield curvature but also astigmatism of the electron-optical system may be considered. In the presence of astigmatism, the focus of rays angled away from the central ray 51 depends on the direction of deviation in the xy-plane. For instance, with respect to two mutually orthogonal directions $v_1$ and $v_2$ ("astigmatism axes") within the xy-plane, rays deviating in angle in the first direction $v_1$ (long dashes 72) are focused at a first image surface 73, whereas rays deviating in the second direction $v_2$ (short dashes 74) are focused at a second, e.g. lower, image surface 75. The difference between the upper and lower image surfaces is called the length of astigmatism A(x,y), or simply astigmatism where this will not cause confusion. The (length of) astigmatism generally depends on the position within the beam field and is typically smaller or even negligible in the middle of the imagefield. Furthermore, the orientation 11, 12 of the astigmatism axes also varies depending on beam field position, but typically the astigmatism axes are oriented in radial and tangential directions relative to the optical axis. Assuming an isotropic angular distribution, the resulting blur spots 76 in this model are ellipses with major and minor axes aligned with $v_1$ and $v_2$, with a minimal circular blur in the middle $z_{focus}$ of the upper and lower foci $z_{upper}$ and $z_{lower}$ ("circle of least confusion"), as depicted in FIG. 12.

Figure 13:
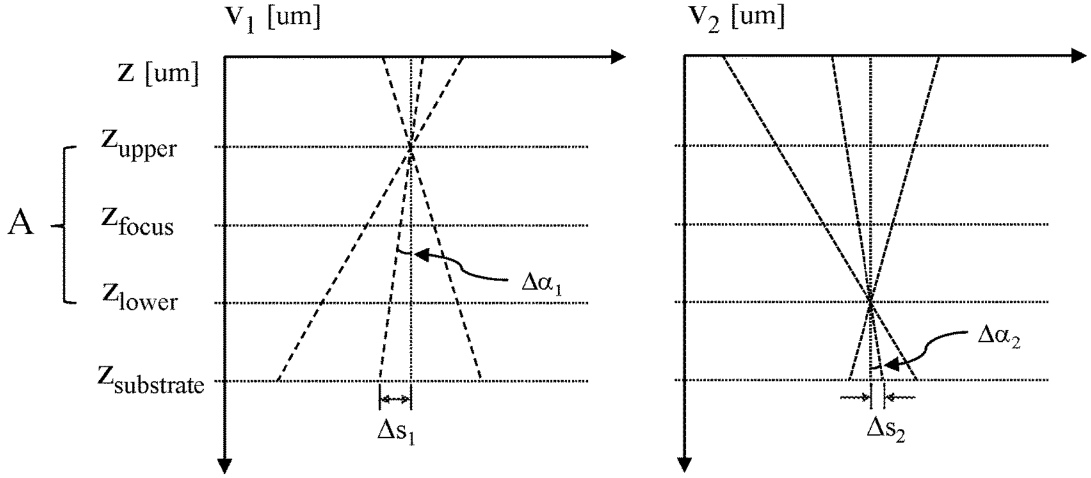
FIG. 13 illustrates the effect of a shift in an operating parameter along the two main axes of astigmatism of an astigmatic beamlet.

Referring to FIG. 13, a small angular shift ($\Delta\alpha_1$, $\Delta\alpha_2$), where $\Delta\alpha_1$ and $\Delta\alpha_2$ describe the change of angle in the $v_1$z-plane (left-hand frame of FIG. 13) and $v_2$z-plane (right-hand frame of FIG. 13) respectively, with respect to the unperturbed direction indicated as vertical full line, again approximately does not change the upper and lower foci and generates a spatial shift ($\Delta s_1$, $\Delta s_2$) in the $v_1v_2$-coordinates. Mathematically, using again the small-angle approximation, we have $$\Delta s_1 \approx (z_{upper} - z_{substrate})\Delta\alpha_1 := Z_1\Delta\alpha_1$$

$$\Delta s_2 \approx (z_{lower} - z_{substrate})\Delta\alpha_2 := Z_2\Delta\alpha_2$$

Introducing diagonal matrices $$D(x, y) = \begin{pmatrix} Z_1 & 0 \\ 0 & Z_2 \end{pmatrix}(x, y)$$

and matrices $V(x,y)=(v_1,v_2)(x,y)$ for a change into an orthogonal basis, which in general will vary across the imagefield, we get $$\Delta s \approx VDV^T\Delta\alpha =: M\Delta\alpha$$

for $\Delta s$, $\Delta\alpha$ representing "vectors" given in Cartesian coordinates x, y. With respect to a general basis, the values $Z_1$ and $Z_2$ represent the eigenvalues of the matrix D. The angular-to-spatial map M(x,y) is a symmetric matrix (it is conceptually similar to the Jacobian matrix of the local spatial distortion as a function of the angular distortion) which, as in the simpler model described earlier, can be used to predict the correlation of angular and spatial displacements (or the relative fingerprints) generated by a pre-object optical element above or at the pattern definition device.

The maps M(x,y) (and D(x,y) via diagonalization) can be determined, for instance, by using a sufficient large number of displacements which each are introduced by variation of a respective operating parameter. In the following the number of the operating parameters thus varied is denoted as K. In other words, the determination of the maps starts by generating a set of K spatial and angular displacements $\Delta s_k(x,y)$, $\Delta\alpha_k(x,y)$, k=1, . . . , K for the optical element (with each pair corresponding to a unique tilting direction, introduced at the optical element); and then a least-squares fit of the symmetric matrix coefficients for a sample or grid of beam field positions x, y (and interpolating, if necessary) is carried out, that is $$M = \arg\min_{\{M|M=M^T\}} \sum_{k=1}^{K} |M\Delta\alpha_k - \Delta s_k|^2.$$

If only a single pair of spatial and angular displacements are available (K=1), only two unknowns per beam field position can be determined reliably. In this case, the matrix V(x,y), which contains the principal astigmatism axes, is favorably fixed to the so-called "meridional planes" (oriented towards the optical axis) and "sagittal planes" (oriented orthogonally to the meridional plane) of the electron-optical system with $$V(x, y) = \frac{1}{\sqrt{x^2 + y^2}}\begin{pmatrix} -y & x \\ x & y \end{pmatrix}.$$

In this case, only two astigmatic foci maps $Z_1(x,y)$ and $Z_2(x,y)$ (or equivalently, the map D(x,y)) will be fitted.

Furthermore, the map matrix D(x,y) can be used to calculate maps Z(x,y) of the best imagefield height of focus (relative to the target), which represent the best (i.e. "least confusion") focus $z_{focus}$ relative to the target surface for each beamlet (or position within the imagefield), and a map of the position-dependent astigmatic length A(x,y) via (compare FIG. 12)

$$Z = \frac{Z_1 + Z_2}{2}.$$
$$A = Z_1 - Z_2$$

In other words, the height of focus and the astigmatic length can be calculated from the eigenvalues of the map matrix D(x,y) as the mean of the eigenvalues and the difference of the eigenvalues (or generally, the width of the range spanned by the eigenvalues), respectively. In a further development, a regularization may be added to the fitting procedure, for instance, to "fill-in" missing information in the generated angular and spatial displacements used for fitting the angular-to-spatial maps. In particular, multipole fields (other than dipoles) do not change beam angles in the center of the imagefield, so the fitted maps will not work reliably there. Instead of fitting the matrices M(x,y) for each (x,y) individually, using regularization, all of them are fit together via $$M = \arg\min_{\{M|M=M^T\}} \sum_{k=1}^{K} |M\Delta\alpha_k - \Delta s_k|^2 + R(M)$$

where R(M) is a regularization term that encodes prior information (e.g. about the spatial variation) of the angular-to-spatial maps M(x,y). Suitable examples of regularization terms are $$R_1(M) = \gamma|\nabla M|^2,$$

$$R_2(M) = \gamma|\nabla^2 M|^2, \text{ or}$$

$$R_3(M) = \gamma_1|\nabla^2(M_{11}+M_{22})/2 - C|^2 + \gamma_2|\nabla(M_{11}-M_{22})|^2 + \gamma_3|\nabla M_{12}|^2.$$

The variants $R_1$ and $R_2$ smooth the variation of the maps across the beam field and interpolate where the displacements disappear. The variant $R_3$, for which the constant matrix C is an extra variable included in the regularized least-squares fit, penalizes variation of the Hessian matrix of $Z=M_{11}+M_{22}$ and minimization variation of the astigmatism. The respective regularization parameters $\gamma_{1/2/3}$ serve to control the amount of smoothing and can be set by the skilled person readily at suitable values.

Figure 14:
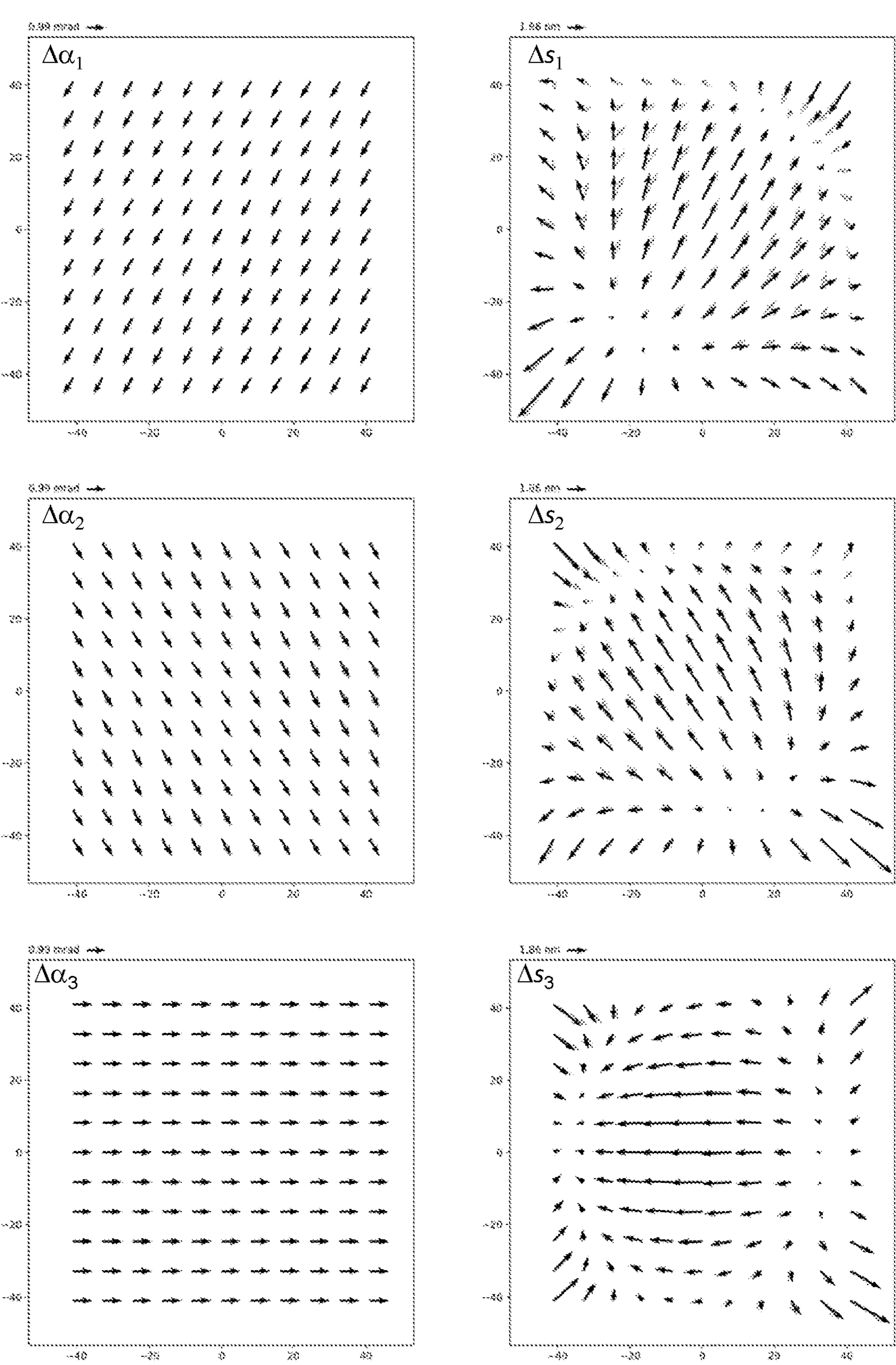
FIG. 14 shows exemplary spatial and angular displacements induced by dipoles, illustrated in six frames representing respective changes in distortion over the imagefield caused by a change in a respective dipole operating parameter.

FIG. 14 shows a set of six frames which give an example of fitting data to exemplary displacements over an image-field of 11×11 positions, illustrated in six frames representing respective displacements over the imagefield; at each frame, an arrow at the upper left corner indicates the scale of the arrows within the frame. As input parameters, angular dipoles in three distinct directions are applied to the beam, and the three frames in the left column show the respective angular beamfield displacements $\Delta\alpha_1$, $\Delta\alpha_2$, $\Delta\alpha_3$. The corresponding generated spatial displacements $\Delta s_1$, $\Delta s_2$, $\Delta s_3$, which have to be measured, are respectively shown as black arrows in the three frames in the right column. After fitting a symmetric angular-to-spatial matrix M for every position (x,y) in the beamlet field, the model fit is depicted as gray arrows in the respective frames in the right column, showing the spatial displacements $\Delta s_1 \approx M\Delta\alpha_1$, $\Delta s_2 \approx M\Delta\alpha_2$, $\Delta s_3 \approx M\Delta\alpha_3$ as obtained from the generated model. Note that, using the matrices M(x,y), corresponding spatial displacements $\Delta s_{new} \approx M\Delta\alpha_{new}$ can now also be estimated for angular displacements $\Delta\alpha_{new}$ which are not included in the fit.

Figure 15A:
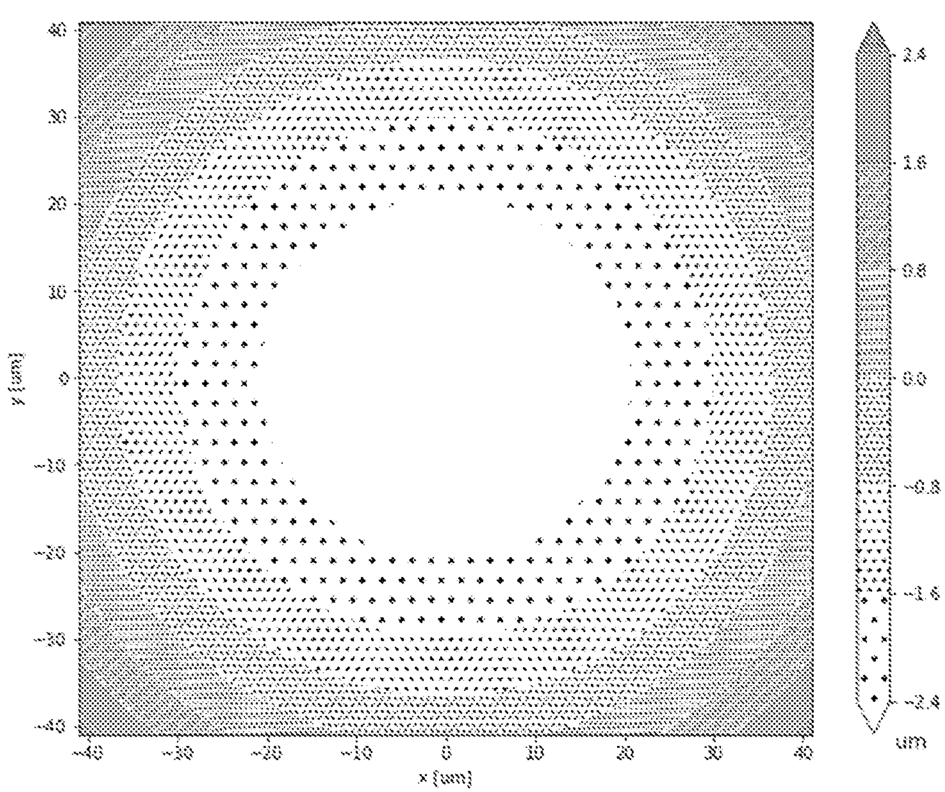
FIG. 15A depicts an imagefield map of averaged focus Z.
Figure 15B:
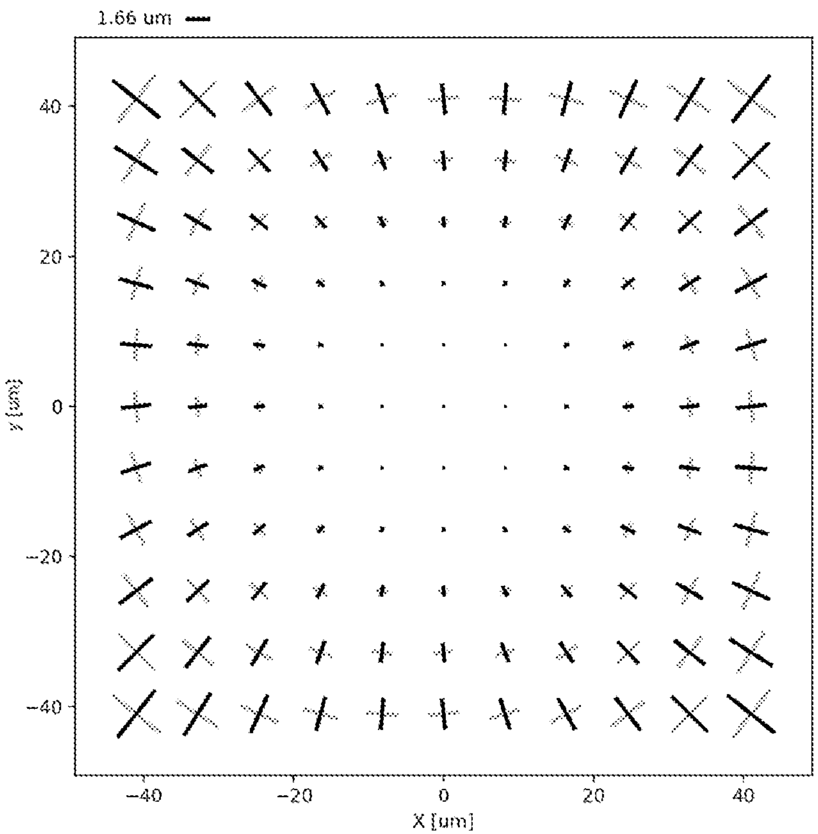
FIG. 15B depicts an imagefield map of the amount and direction of astigmatism A.
Figure 15C:
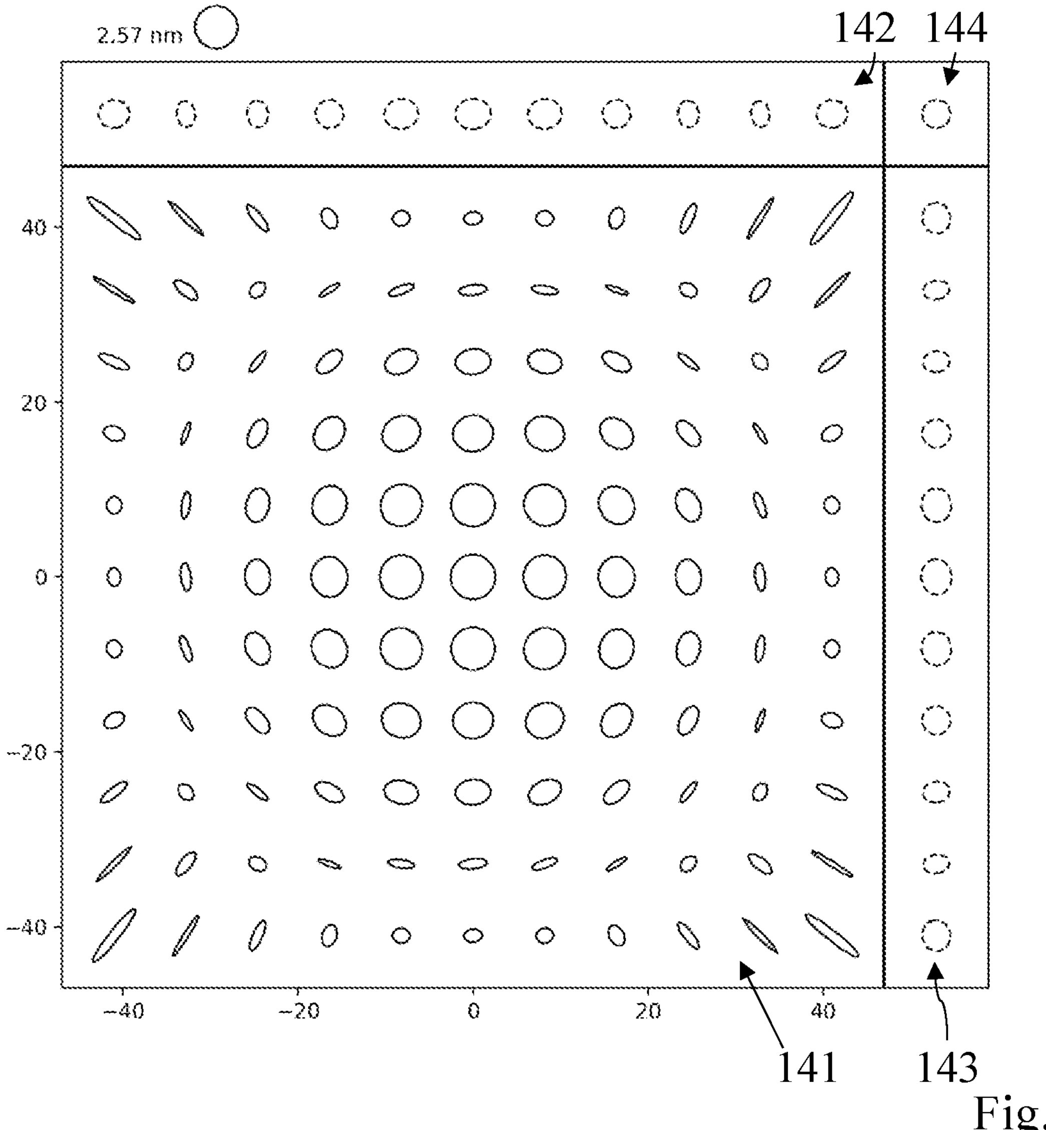
FIG. 15C depicts an imagefield map of blur spots.

Examples of imagefield focus maps generated from the displacements in FIG. 14 are shown in FIGS. 15A-C. FIG. 15A-C depicts an imagefield height of focus map Z(x,y), which is a rotationally symmetric paraboloid with around 5 μm focal difference between a bottom position (at the center of the imagefield) and top value (at the edges of the imagefield), as seen in the direction contrary to the optical axis. In this example, it is assumed that the target surface is positioned at the ideal focal plane at height Z=0 exactly between the top and bottom foci, which minimizes the maximal defocus. FIG. 15A encodes the height Z through varying shades, as indicated in the scale on the right of the drawing. The corresponding astigmatic length is depicted in FIG. 15B as crosses oriented in the principal astigmatic directions with sizes illustrating the amount of astigmatism. Each cross represents two types of ray sets: (i) so-called "meridional rays" which propagate within meridional planes as indicated by the respective black axes of the crosses, and (ii) so-called "sagittal rays" which propagate within sagittal planes as indicated by the respective gray axes of the crosses; the meridional rays are focused above sagittal rays, with the amount astigmatism (difference in focus height) depending on the beam field position. In the example given here, the astigmatism is also rotationally symmetric, negligible in the center and around 3 μm in the boundary. Note that in more realistic situations, actually measured image-field focus maps will typically deviate from the idealized situation depicted in FIGS. 15A-C.

Furthermore, angular-to-spatial maps M(x,y) can be used to determine the behavior of the blur within the beam field at the target surface for a given distribution of beam landing angles or numerical aperture. For instance, if the angular distribution is isotropic and homogeneous across the image-field (which is a suitable assumption in most application cases of the invention; the precise value is of little relevance since only changes of blur are considered in the context of the invention) and normally distributed with standard deviation $\sigma_{angle}$ the corresponding distribution of landing positions (i.e. blur) is a bivariate Gaussian with covariance matrix Σ(x,y) given by $$\Sigma = \sigma_{angle}^2 MM^T = \sigma_{angle}^2 VD^2V^T.$$

A typical blur distribution 141 (showing ellipses representing 1σ-blur spots) corresponding to the displacements in FIG. 14 and focus and astigmatism maps in FIG. 15A and FIG. 15B is shown in FIG. 15*c*. The substrate (i.e., target) will suitably be positioned at the ideal focal plane, thus balancing the blur in the corners with the blur in the middle of imagefield. The blur is minimal where the target surface intersects the focal surface. The resulting average row, column and imagefield blur spots are additionally shown in a top row 142, right-hand column 143 and in the right upper corner 144 added to the map 141, respectively represented as dashed ellipses. (The circle above the upper left corner indicates the scale of the ellipses in this drawing.)

The skilled person will appreciate that, since imagefield curvature and astigmatism affect the blur within the image-field, they are relevant for tool performance, and regular checks of the corresponding maps (which may change over time) will help to guarantee stable performance of the exposure apparatus. Furthermore, the maps can be useful for diagnostics and debugging of the exposure apparatus, e.g. to determine misalignment or insufficient calibration/tuning of the components of the illumination system after maintenance (which may deteriorate the symmetry of either of the maps, leading, for instance, to tilts in the imagefield topography).

Figure 17:
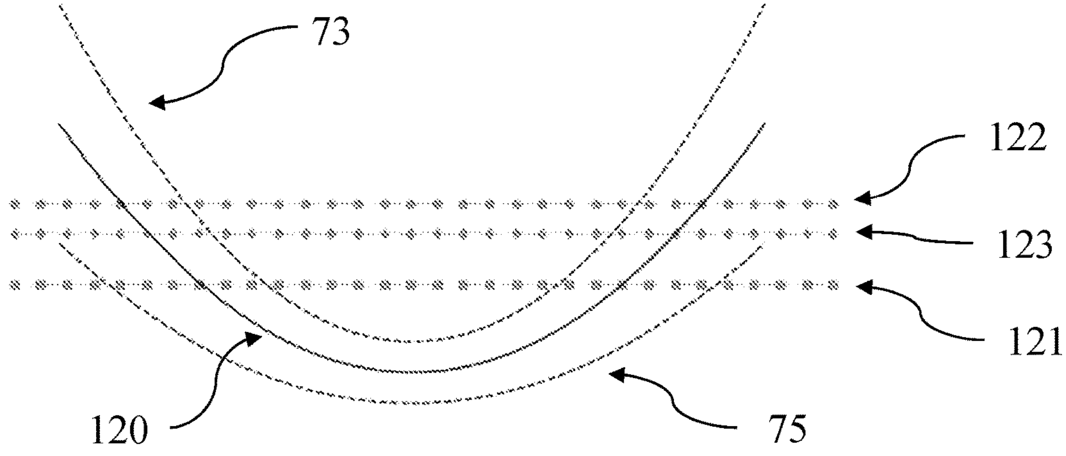
FIG. 17 illustrates the determination of a best height position of the imagefield.

In another embodiment of the invention illustrated in FIG. 17, the determined focal properties are utilized to determine a "best" Z-position of the image plane as a best nominal position of the target surface. The method explained above allows for the determination of the first and second image surfaces 73 and 75 of astigmatic focus (see FIG. 12), as well as the image surface of least confusion 120. One suitable choice of image plane is the average height of focus 121, i.e., the Z-position value which minimizes the average amount of defocus, which can be calculated by $$Z_{mean} = \frac{1}{\text{area }(D)} \int\int_{x,y\in D} Z(x, y)dxdy$$

where D is the set of imagefield positions and area(D) is the area of the beam field. In practice the integral can be calculated as a sum over all grid points; in case the grid points are not in a regular spatial arrangement at unform distance, the grid points will be weighted with respect to respective areas associated with the grid points. Another suitable choice of the "best" Z-position may be the plane 122 that minimizes the maximal amount of defocus, i.e.

$$Z_{min\_max} = \frac{1}{2}(\max(Z_{upper}) - \min(Z_{lower})).$$

Yet another favorable choice may be a position of image plane 123 that minimizes the variation of the average blur within in a beam-field row (compare column 143 in FIG. 15C). That is, with Lx denoting the width of the imagefield along the coordinate parallel to the scanning direction (here denoted as X) along which the beam field is moved over the target surface, $$Z_{min\_rowblur\_var} = \underset{z}{\operatorname{argmin}}\left|\operatorname{var}_y\left(\frac{1}{L_x}\int_{x=0}^{L_x}\sum\nolimits_z(x, y)\,dx\right)\right|.$$

Here, $$\sum\nolimits_z(x, y) = \sigma_{angle}^2(M - z)(M - z)^T$$

is the blur covariance matrix distribution over the imagefield with the imageplane positioned at a position z (relative to the substrate). This choice of the intermediate plane 123 is stimulated by the notion that a writing process according to the "trotting mode" as described in U.S. Pat. Nos. 7,777,201 and 9,053,906 of the applicant will involve a mixing of beamlets along rows, corresponding to a line of aperture images.

Alternatively, one may pick the imagefield position with minimal blur variation (in both axial directions)

$$Z_{min\_blur\_var} = \underset{z}{\operatorname{argmin}}\left(\operatorname{var}_{x,y}\left(\operatorname{trace}\sum\nolimits_z(x, y)\right)\right).$$

Those skilled in the art can easily envision variations of the above, e.g. minimizing other measured of blur variation such as standard deviation or median absolute deviation, minimizing the summed axial blur variation rather than the variation of total (trace of covariance) blur, etc.

Furthermore, the invention enables to determine an average astigmatism in the beam field, namely by calculating $$M_{mean} = \frac{1}{\operatorname{area}(D)}\int\int_{x,y\in D} M(x, y)\,dxdy$$

and thus extracting the average astigmatism direction via diagonalization of $M_{mean}$ as described earlier. A typical embodiment of the invention using this approach will be based on optical elements that allow for a modulation of the astigmatism in the beam field, and by exploiting these optical elements the determined mean astigmatism $M_{mean}$ can be removed. In the case of a MBMW, for instance, this may be accomplished by applying a quadrupole field in the writing multipole 12*c* that focuses the beam in the direction corresponding to the upper focus of the mean astigmatism, and de-focusses in the orthogonal direction.

The above considerations apply to displacements generated by pre-object optical elements, which are located above or at the object to be imaged by the projection system, i.e. the apertures. For optical elements significantly "below" (i.e., closer to the target) the pattern definition device, it is possible to obtain analogous approximation matrices, which describe the correlation of spatial and angular displacements, by suitable fitting procedures using a procedure corresponding to the methods described above. The corresponding focal and astigmatism maps, however, no longer represent the imaging characteristics of the whole projection system, but merely of the parts of the projection system below the optical element in question (imaging a "virtual" object at the position of said optical element).

Figure 16:
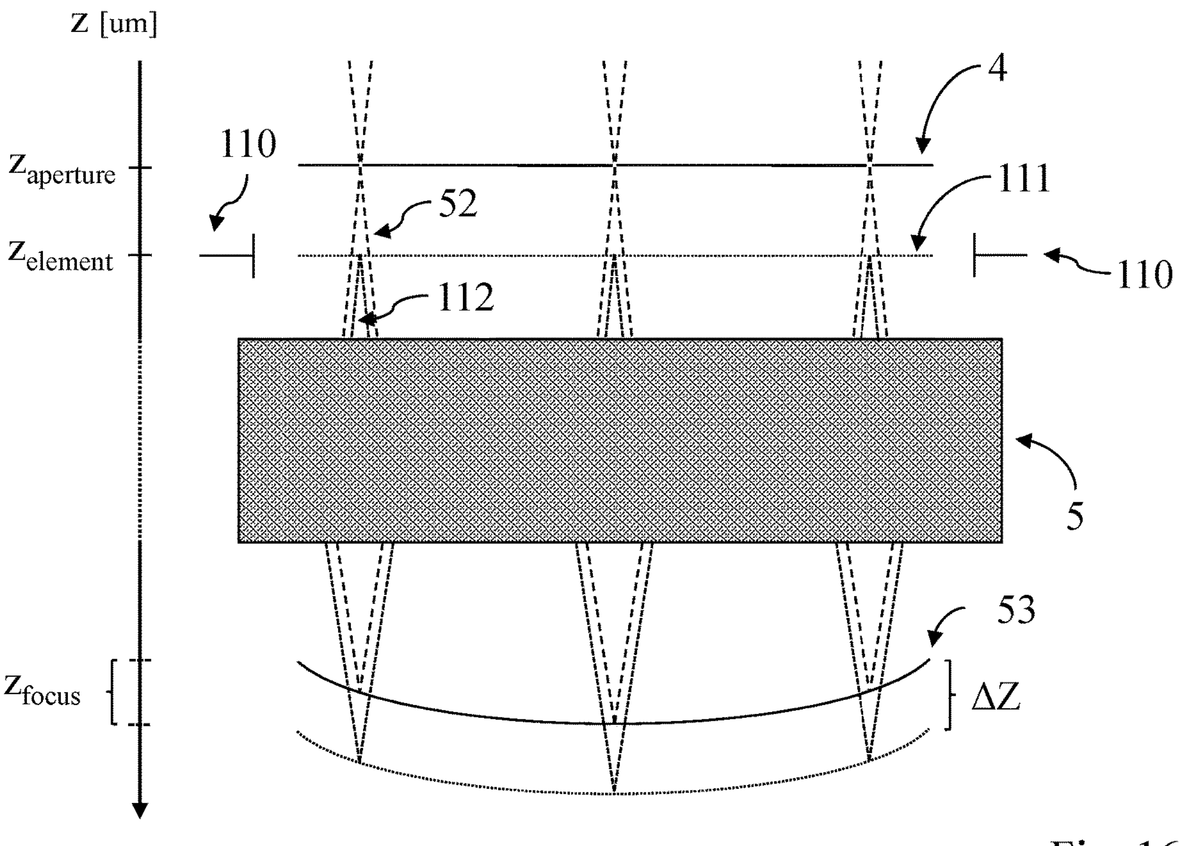
FIG. 16 illustrates the effect of object shift occurring directly after the pattern definition device.

FIG. 16 illustrates the special case of electron-optical elements 110 that are located between the pattern definition device 4 and the projection system 5. A "virtual object" 111 at the position (along the optical axis) of the optical element is imaged below (in the direction of the optical axis) the aperture images, with the focal shift AZ depending on the focal lengths and relative positioning of the electron-optical lenses. Since, typically, rays 52 emanating from the pattern definition device are substantially telecentric (with residual angles in the order of 50 μrad), equivalent rays 112 emanating from the shifted virtual object are passing through the projection system at almost the same radial offset to the optical axis, which implies that they are subject to similar aberrations and therefore exhibit similar imagefield curvature and astigmatism. Hence, to estimate height of focus maps $Z_{post}$ for post-object optical elements 111, one can use a pre-object height of focus map $Z_{pre}$ with an offset represented by the focal shift AZ:

$$Z_{post}(x, y) = Z_{pre}(x, y) + \Delta Z.$$

The same holds for the corresponding angular-to-spatial maps, that is, $$M_{post}(x, y) = M_{pre}(x, y) + \Delta Z$$

The offset ΔZ only depends on the position of the optical elements and the focal lengths of the projection system 5 and can be determined experimentally.

Optimization of the Imagefield Topography

As one further advantageous aspect of the invention, the imaging properties of the exposure apparatus may be optimized with respect to the focal properties. For this purpose, for a given set of N optical elements $E_1, \ldots, E_N$ used for the tuning of the focal properties within the projection system 5, a corresponding number of operating parameters $V_{E_1}, \ldots, V_{E_N}$ are chosen, which allow to optimize a specific aspect of the focal properties as a function of the operating parameters. A typical approach is to perform this optimization based on a suitably predefined evaluation function (which has a small value for desirable focal properties and assumes large values for undesirable properties), by minimizing the evaluation function over the tuning voltages. Various aspects of the projection system can be considered for optimization, with some typical examples given in the following paragraphs.

In an embodiment, the spatial variation of the imagefield focus may be represented by the evaluation function $$T_v(Z, A) = \gamma_Z |\nabla Z|^2 + \gamma_A |A|^2$$

which is minimized, with the weights $\gamma_Z$, $\gamma_A$ encoding the relative importance of the focus variation $\nabla Z$ and astigmatism A (which are themselves functions of $V_{E_1}, \ldots, V_{E_N}$); the focus variation can be calculated, e.g., using differences of focus values Z between neighboring grid positions along the X- and Y-directions, and subsequent summation over the squares of absolute values thereof. In another suitable embodiment, instead of penalizing variation of the focus across the beam field, the imagefield curvature and tilt of focus is optimized. For this purpose, a bivariate quadratic polynomial $$Q(x, y) = c_{xx}x^2 + c_{xy}xy + c_{yy}y^2 + c_x x + c_y y + c \approx Z(x, y),$$

may be used as an "ansatz", with the quadratic terms specifying the curvature and the linear terms; the polynomial is fit to Z(x,y), leading to the optimization evaluation function $$T_{curvature}(Z, A) = \gamma_C\left(|c_{xx}|^2 + |c_{xy}|^2 + |c_{yy}|^2\right) + \gamma_T\left(|c_x|^2 + |c_y|^2\right) + \gamma_A|A|^2$$

with the constants $\gamma_C$, $\gamma_T$, $\gamma_A$ weighing the relative importance of imagefield curvature, tilt and astigmatism.

In another variant, instead of optimizing focus and astigmatism, the blur covariance matrices $\Sigma(x,y)$ and their variation may be optimized directly, e.g. via $$T_{blur}\left(\sum\right) = \gamma_\Sigma \left|\sum\right|^2 + \gamma_{\nabla\Sigma}\left|\nabla \sum\right|^2.$$

Furthermore, instead of minimizing the mentioned aspects of the imagefield focus or its corresponding blur, for some purposes it may be useful to match reference angular-to-spatial maps $M_{ref}$ to ensure similar focus and astigmatism (and hence a similar behavior of the blur), e.g. using $$T_{match}(M) = |M - M_{ref}|^2.$$

Other suitable variants for optimizing similar aspects of the imagefield focus, astigmatism or blur are easily conceived by those skilled in the art. Also note that when optimizing an evaluation function defined above, it may be necessary to add specific constraints (e.g. maximal and minimal voltages, total focal length of the projection system, minimal and maximal blur, etc.) to reflect technical feasibility.

To optimize the focal properties within an exposure apparatus, a set of optical elements may be chosen that are distinct from those utilized for distortion optimization (e.g. lens voltages to optimize the imaging properties, multi-pole voltages to optimize angular and spatial distortions), or the optimization may be performed jointly using the combined set of optical elements, for instance with an evaluation function $$T_{combined}(Z, A, \alpha, s) = T(Z, A) + \gamma_\alpha|\alpha|^2 + \gamma_s|s|^2,$$

wherein T is one of the above evaluation functions and $\alpha(V_1, \ldots, V_N)$ and $s(V_{E_1}, \ldots, V_{E_N})$ are additional terms for the angular and spatial distortions for the given tuning voltages.

Optimization Methods

In a further suitable implementation of the invention according to the following embodiment, the voltages of a given number of electrode elements are determined by performing a full non-linear optimization of the voltages $V_{E_1}, \ldots, V_{E_N}$ within a simulation of the exposure apparatus. The mentioned voltages represent the operating parameters in this embodiment, but the skilled person will appreciate that beside voltages of electrodes, there may by other types of operating parameters depending on the individual implementation, such as feeding currents of magnetic coils of magnet lenses, positions of movable components, etc.

Another suitable process utilizes a linearization with so-called "fingerprints" of the optical elements. A "fingerprint" of a quantity (which is dependent from a given parameter of a component, such as the voltage of an electrode) with respect to a specific component is defined as the amount that the quantity changes when the parameter of that component is changed by a unit; this parameter is an operating parameter of the respective component, such as the voltage of an electrostatic electrode. For a quantity q to optimize, e.g. q=Z (imagefield focus), q=s (spatial distortion) or q=$\Sigma$(blur covariance matrix) we consider fingerprints F(q, E) of the quantity q with respect to the voltages of elements E, wherein the elements belong to a set of optical electron-optical optimization elements with given reference voltage $$V_E^{ref};$$

thus, the fingerprints satisfy $$q\left(V_E^{ref} + \Delta V_E\right) - q\left(V_E^{ref}\right) = F(q, E)\Delta V_e$$

for a voltage modulation $\Delta V_e$. Fingerprints are conceptually similar to derivatives. They can be determined using the formula above, that is, by first measuring the respective quantity q (e.g. imagefield focus or astigmatism), modulating the tuning voltage of the optical element E by a small amount $\Delta V_e$ (typically in the order of 0.01 V up to several volts, depending on the optical element), re-measuring q, determining the difference with respect to the first measurement, and dividing the difference by the change in voltage $\Delta V_e$.

Figure 18A:
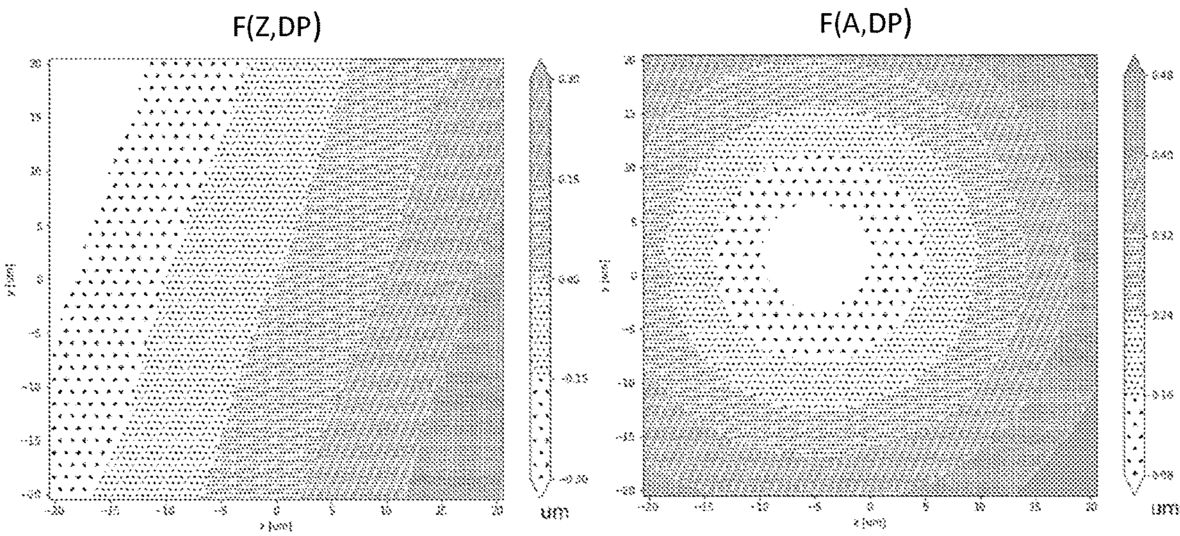
FIGS. 18A and 18B show examples of fingerprints of a multipole, with FIG. 18A showing the effect of a dipole field and FIG. 18B showing the effect of an "octupole" field, and in each respectively, the left-hand frame shows the change in height of focus and right-hand frame shows the change in amount of astigmatism.
Figure 18B:
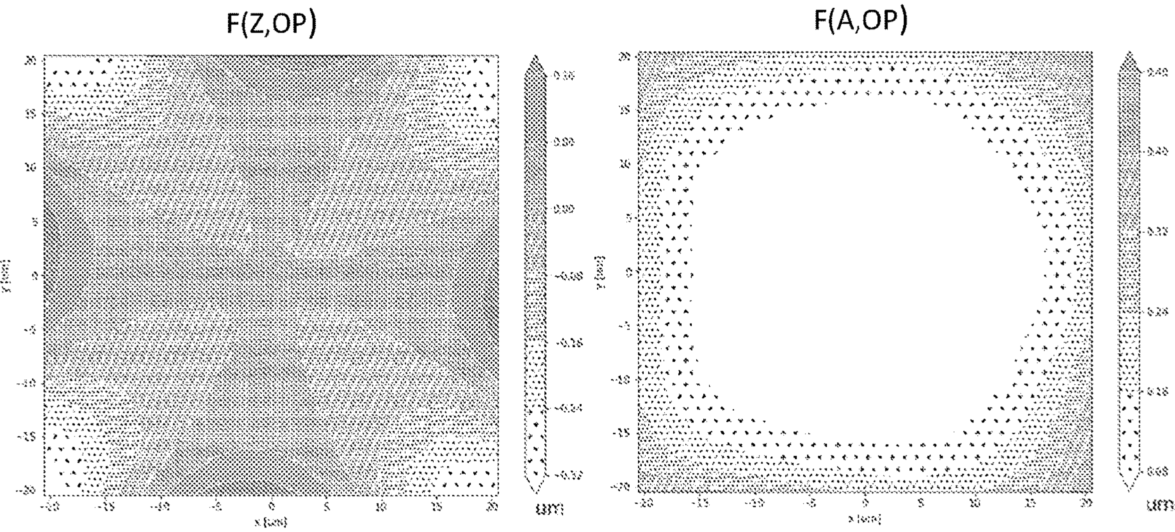

Examples of fingerprints of a multipole (close to the pattern definition device) for the imagefield focus (left-hand frame) and astigmatism (right-hand frame) are shown in FIGS. 18A and 18B. A dipole field, as illustrated in FIG. 18A, tilts the image surface Z and shifts the center of the astigmatism A. The effect of an "octupole" field is shown by means of the fingerprints depicted in FIG. 18B, in that it generates an octupole-like effect on the image surface and selectively increases the astigmatism in the boundary of the beamfield while decreasing it in the center.

Using fingerprints and assuming that electron-optical optimization elements act independently one from another, a quantity of interest q can be approximated by superposition according to a first-order Taylor expansion:

$$q\left(V_{E_1}^{ref} + \Delta V_{E_1}, \ldots , V_{E_N}^{ref} + \Delta V_{E_N}\right) \approx \sum_{n=1}^{N} F(q, E_n) \cdot \Delta V_{E_n} + q\left(V_{E_1}^{ref}, \ldots, V_{E_N}^{ref}\right).$$

For a given evaluation function T, optimal voltage changes can then be determined by linear or non-linear optimization over $\Delta V_{E_1}, \ldots, \Delta V_{E_N}$ without the need of additional measurements. The best choice of optimization routine depends on the evaluation function and possible constraints, but typically, standard non-linear least-squares solvers suffice.

Suitably, the steps described above may be repeated several times, in order to better account for non-linearity of the quantities of interest. A full procedure for optimizing tuning voltages $V_{E_1}, \ldots, V_{E_N}$ with respect to evaluation function $T(q_1, \ldots, q_M)$, where $q_1, \ldots, q_M$ are the quantities of interest (to be optimized) is illustrated in a flowchart in FIG. 19.

Figure 19:
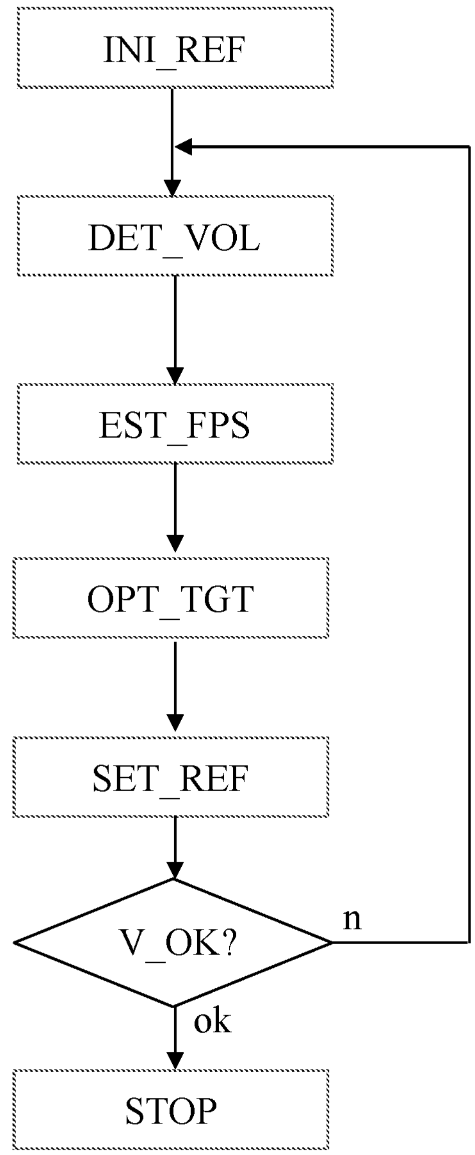
FIG. 19 shows a flow diagram of a process of calculating optimized operating parameters.

Referring to FIG. 19, in an initial step denoted "INI_REF" a given set of reference (or starting) voltages $$V_{E_n}^{ref}$$

is determined (where n=1, . . . . N indexes the voltages as input parameters). In the step denoted "DET_VOL", the values $$q_m^{ref} := q_m\left(V_{E_1}^{ref}, \ldots, V_{E_N}^{ref}\right)$$

for m=1, . . . , M of the quantities of interest are determined for the reference voltages. Next, in step "EST_FPS", fingerprints $F(q_m, V_{E_n})$ for m=1, . . . , M, n=1, . . . . N of the quantities of interest are measured or estimated. Continuing in the step denoted "OPT_TGT", using the linear approximation of the quantities of interest with fingerprints and reference values, optimal voltage changes $\Delta V_{E_1} \ldots, \Delta V_{E_N}$ can be obtained by minimizing an evaluation function, i.e. finding $$\min_{\Delta V_{E_1}, \ldots, \Delta V_{E_N}} T\left(\sum_{n=1}^{N} F(q_1, E_n) \cdot \Delta V_{E_n} + q_1^{ref}, \ldots , \sum_{n=1}^{N} F(q_1, E_n) \cdot \Delta V_{E_n} + q_M^{ref}\right).$$

Then, in step "SET_REF" the determined optimal voltage changes $\Delta V_{E_n}$ are added to the reference voltages to obtain new reference voltages which are used to replace the reference voltages. These new reference voltages are then used for a next iteration or application to the projection system (by branching along "n"), unless in the decision step denoted "V_OK" it is detected that the values obtained realize a predetermined stopping condition (branching along "ok" to "STOP"). This stopping condition may be, for instance that the absolute values of voltage changes $\Delta V_{E_n}$ are below specific respective threshold values, or that the absolute value of the evaluation function (or its change with respect to a previous value thereof) has fallen below a predetermined threshold value.

The invention claimed is:

1. A method for determining focal properties in a target beam field of a charged-particle multi-beam processing apparatus, said apparatus comprising a charged-particle source generating a beam of electrically charged particles, a pattern definition device comprising an aperture array composed of a multitude of blanking apertures, said aperture array configured to generate a corresponding multitude of beamlets when said beam is directed at and penetrates the pattern definition device, a projection optics including at least one charged-particle optical lens, configured to direct the beamlets onto a beam field within a surface of a target provided to said apparatus, wherein the beamlets impinge on the beam field at respective landing positions and with a respective landing angle with respect to the surface of the target, each beamlet forming an aperture image of a respective aperture at a respective location close to the target surface, said aperture image having at least one focal property including a height of focus, which describes the distance of the aperture image from the surface of the target, said projection optics being able to tilt the landing angles of the beamlets by modifying at least one operating parameter of at least one optical component of the projection optics, the method being characterized by the steps of:

defining a set of measurement positions in the beam field;

introducing a shift in at least one operating parameter of an optical component of the projection optics, causing a tilting of the beamlet landing angles;

determining amounts of displacement of the beamlets at the target surface for said measurement positions as a result of said shift, and determining the change of landing angles at the target surface for said measurement positions as a result of said shift;

generating a spatially variable map, said map describing a mapping from said change of landing angles to the amounts of displacement as a function of the position within the beam field for an area in the beam field which at least covers the set of measurement positions or the entire beam field;

extracting, for a plurality of target positions located across the beam field, focal properties from said map, said focal properties including at least one of height of focus, astigmatic length, and a size of blur along at least one directions.

2. The method of claim 1, further comprising the step of determining improved operating parameters of the projection optics, using an evaluation function which yields an evaluation value as a function of operating parameters and/or one or more specific quantities selected from the focal properties, including finding an extremum of the evaluation function, and determining improved operating parameters from the values of operating parameters where the evaluation function assumes the extremum found.

3. The method of claim 1, the method further comprising a step of determining optimal values of operating parameters of the projections optics, said operating parameters comprising one or more tuning voltages of one or more electrostatic components of the projection optics, using an evaluation function being calculated from specific quantities, which specific quantities include at least one of height of focus, of astigmatic length and of blur, such that the variation of the specific quantities over the beam field is minimal or within a predefined reference state.

4. The method of claim 2, wherein said specific quantities further include at least one of: the tilting of the beamlet landing angles, amounts of displacement of the beamlets, and one or more derivatives thereof with respect to a respective one of the operating parameters.

5. The method of claim 1, wherein the optimal values of the operating parameters, in particular tuning voltages, are determined using a simulation of the exposure apparatus.

6. The method of claim 1, wherein optimal values of the operating parameters, in particular tuning voltages, are determined by the additional steps of determining fingerprints, each fingerprint representing the change in focal properties for a unit change of a respective operating parameter, determining values of operating parameters which optimize the superposition of the determined focal properties and the generated change in focal properties expressed by a linear combination of said fingerprints, with the coefficients representing the changes in operating parameters.

7. The method of claim 6, wherein said additional steps are iterated until a predetermined stopping condition calculated using the increment of operating parameters with respect to the previous iteration is reached.

8. The method claim 1, further comprising, with respect to a selected one of the focal properties, such as height of focus or astigmatism: averaging the focal property over the beam field to obtain an averaged value; calculating the difference between a desired value of the focal property and the averaged value; determining a correction to at least one operating parameter which corresponds to said difference; and applying the correction to the at least one operating parameter of the respective optical components.

9. The method claim 1, wherein the map from change of landing angles to the amounts of displacement is linear.

10. The method of claim 9, wherein the map corresponds to multiplication with a factor value, said factor value representing height of focus of the beamlets as a function of the position within the beam field.

11. The method claim 1, wherein the spatially variable map is realized as a matrix, and the focal properties are calculated using eigenvalues of said matrix.

12. The method of claim 11, wherein height of focus is extracted from said map by calculating the mean of eigenvalues of said matrix and/or astigmatism is extracted from said map by calculating the width of a range over which the eigenvalues of said matrix extend.

13. The method claim 1, wherein in the step of extracting, the focal properties include at least the astigmatic length, or at least height of focus and astigmatic length.

14. The method claim 1, wherein in the step of extracting, the focal properties include height of focus and astigmatic length.

15. The method claim 1, wherein the step of generating a spatially variable map includes fitting a model function of the map to the data of amounts of displacement and change of landing angles, said model function optionally including an additional regularization terms, said regularization term including the first and/or second spatial derivatives of the height of focus, astigmatic length, or other values derived from the spatially variable map.

16. The method of claim 1, further comprising the step of using said beam focal properties to generate a map of the spatially variable blur of the exposure apparatus.

17. The method of claim 1, wherein the at least one operating parameter includes at least one of:

a voltage of a dipole electrode;

a multipole voltage of a multipole electrode;

an electrostatic voltage of a rotationally symmetric lens;

an electrostatic voltage of an optical component located between the pattern definition device and the projection optics; and an electrostatic voltage of an optical component located immediately in front of or after the pattern definition device.

18. The method claim 1, wherein the tilting of the beamlet landing angles and the amounts of displacement of the beamlets are measured using a distortion measurement device located within the multi-beam charged particle exposure apparatus, preferably during or directly before a writing process to the target.

19. The method claim 1, wherein said plurality of target positions coincides with nominal locations of the beamlets in the beam field or a representative subset thereof.

* * * * *